US012273282B2

(12) United States Patent
Clark et al.

(10) Patent No.: US 12,273,282 B2
(45) Date of Patent: *Apr. 8, 2025

(54) SYSTEM-IN-PACKAGE NETWORK PROCESSORS

(71) Applicant: Intel Corporation, Santa Clara, CA (US)

(72) Inventors: Kevin Clark, San Jose, CA (US); Scott J. Weber, Piedmont, CA (US); Ravi Prakash Gutala, San Jose, CA (US); Aravind Raghavendra Dasu, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/587,744

(22) Filed: Feb. 26, 2024

(65) Prior Publication Data

US 2024/0205167 A1    Jun. 20, 2024

Related U.S. Application Data

(63) Continuation of application No. 18/177,417, filed on Mar. 2, 2023, now Pat. No. 11,916,811, which is a continuation of application No. 17/528,005, filed on Nov. 16, 2021, now Pat. No. 11,611,518, which is a continuation of application No. 16/369,889, filed on Mar. 29, 2019, now Pat. No. 11,190,460.

(51) Int. Cl.
*H04L 49/109* (2022.01)
*H01L 23/538* (2006.01)
*H01L 25/065* (2023.01)
*H04L 49/15* (2022.01)

(52) U.S. Cl.
CPC ........ *H04L 49/109* (2013.01); *H01L 25/0652* (2013.01); *H04L 49/15* (2013.01); *H01L 23/5386* (2013.01); *H01L 2225/06513* (2013.01); *H01L 2225/06517* (2013.01)

(58) Field of Classification Search
None
See application file for complete search history.

(56) References Cited

U.S. PATENT DOCUMENTS

| | | |
|---|---|---|
| 6,091,263 A | 7/2000 | New et al. |
| 8,719,753 B1 | 5/2014 | Chow et al. |
| 9,432,298 B1 | 8/2016 | Smith |
| 2007/0088537 A1 | 4/2007 | Lertora et al. |
| 2012/0002392 A1 | 1/2012 | Karp et al. |
| 2014/0035642 A1 | 2/2014 | Venkata et al. |
| 2015/0109024 A1 | 4/2015 | Abdelfattah et al. |

(Continued)

OTHER PUBLICATIONS

Extended European Search Report for EP18211451.2 mailed Mar. 22, 2019, pp. 1-9.

(Continued)

*Primary Examiner* — Hong Shao
(74) *Attorney, Agent, or Firm* — Fletcher Yoder, P.C.

(57) ABSTRACT

This disclosure relates to integrated circuit devices that may include a network processor in a data processing die and an on-package memory in a base die. The data processing die may implement one or more network functionalities that may exchange data with low-latency memory, high capacity in the base die. The data processing die may be programmable fabric, which may be dynamically reconfigured during operation.

20 Claims, 17 Drawing Sheets

(56) References Cited

U.S. PATENT DOCUMENTS

| | | |
|---|---|---|
| 2015/0113196 A1 | 4/2015 | Ebert |
| 2017/0118111 A1 | 4/2017 | Bandic et al. |
| 2017/0220509 A1 | 8/2017 | Kaviani et al. |
| 2019/0042127 A1 | 2/2019 | Weber et al. |
| 2019/0043536 A1 | 2/2019 | Weber et al. |
| 2019/0044519 A1 | 2/2019 | Atsatt et al. |
| 2020/0057717 A1 | 2/2020 | Jayasena et al. |
| 2020/0236064 A1 | 7/2020 | Frankel et al. |

OTHER PUBLICATIONS

Extended European Search Report for EP Application No. 18211450.4 mailed May 28, 2019.
Extended European Search Report for EP Application No. 19175768.1 mailed Nov. 25, 2019.
Extended European Search Report for EP 20155589.3 mailed Aug. 4, 2020, 10 pages.

SYSTEM-IN-PACKAGE NETWORK PROCESSORS

CROSS REFERENCE TO RELATED APPLICATIONS

This application is a continuation of and claims priority to U.S. patent application Ser. No. 18/177,417, entitled "System-In-Package Network Processors," filed Mar. 3, 2023, which is a continuation of and claims priority to U.S. patent application Ser. No. 17/528,005, entitled "System-In Package Network Processors," filed Nov. 16, 2021, which issued as U.S. Pat. No. 11,611,518 on Mar. 21, 2023, which is a continuation of and claims priority to U.S. patent application Ser. No. 16/369,889, entitled "System-In Package Network Processors," filed Mar. 29, 2019, which issued as U.S. Pat. No. 11,190,460 on Nov. 30, 2021, each of which is hereby incorporated by reference in its entirety for all purposes.

BACKGROUND

This disclosure relates to single-package multi-die devices for data-processing applications and, more specifically, to network processors that may exchange data with on-package memory.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Many electronic applications that employ data processing may benefit from high capacity, low latency, and/or high throughput memory for large data structures. Examples of applications that perform such data processing include networking, data center, storage, wireline, wireless, and/or other communication systems. These applications may employ large data structures to perform network functions. Examples of data structures include lookup tables (e.g., hash tables), traffic managers, QoS queues, policers, statistics, systems, link list management, or payload buffers. The bandwidth and/or latency in accessing these data structures may be a limiting factor in the performance of these systems. In order to provide high capacity, high bandwidth, and/or low-latency memory, expensive solutions that rely on external devices are often used.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
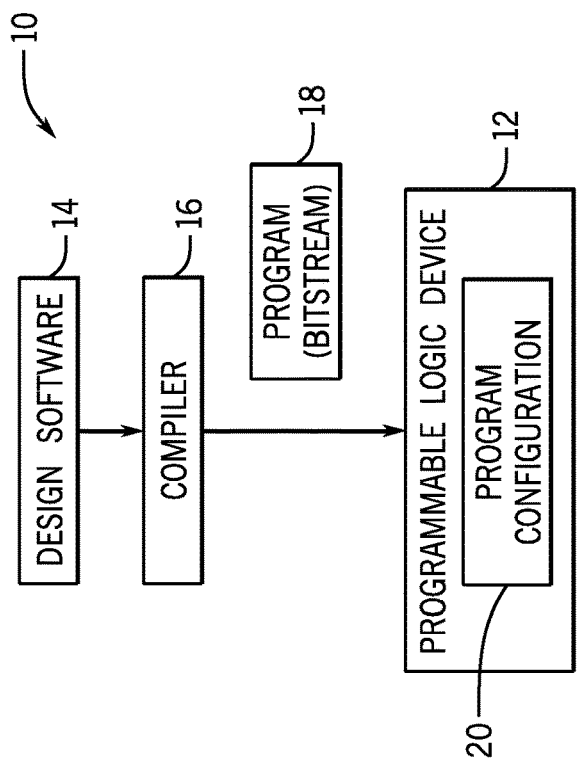
FIG. 1 is a block diagram of a programmable logic device that can be programmed with a circuit design for network applications, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Many modern applications of data center, networking, and/or storage infrastructure may operate using network switches and routers. Examples of such systems include devices that implement data networks (e.g., Ethernet or synchronous optical network (SONET) protocols), storage networks (e.g., Fibre Channel), and/or converged networks (e.g., remote direct memory access (RDMA) over Infiniband or RDMA over Converged Ethernet (RoCE)) to transport and/or process network packets. These applications may also employ network devices, such as interface cards (NICs), host bus adapters (HBAs), and/or converged network adapters (CNAs) that may perform inspection of packets to perform routing, inspection, security, and/or other functionalities. Furthermore, virtualized operating systems (e.g., VMware) may share a NIC, HBA and/or CNA device between multiple virtual machines and the devices may employ virtualized direct memory access (DMA) queues to access memory managed by the virtualized operating systems. Furthermore, certain artificial intelligence (AI) and/or network function virtualization (NFV) applications may employ dedicated hardware on network devices to perform packet processing functions specific to the application.

The highly flexible nature of programmable logic devices makes them an excellent fit in the implementation the above-discussed networking tasks. Programmable logic devices are devices that may include customizable and reprogrammable circuitry that can perform digital operations and/or logic functions. Programmable logic devices may be used to implement network processors, or portions thereof, in applications such as network packet routing and processing, data center management, storage management, and other communication applications. Such systems may receive packets or data streams, perform functions on the data, such as filtering, decoding or encoding, encrypting or decrypting, routing, buffering, queueing, prioritizing, policing, among other packet processing functions, and transmit the processed packets and/or data streams. Due to its flexibility, programmable logic devices may be employed to implement customized and/or dynamic network functions, with a resource usage that may scale with the application and/or a specific implementation of a data center, network, and/or storage system.

In order to facilitate the operation of many of these applications and functionalities, the programmable logic device may contain large data structures and/or transport large payload data. As an example, the performance of certain functions may be facilitated by fast access to large data structures, such as lookup tables, traffic managers, traffic policer tables, remote direct memory access (RDMA) descriptor queues, cryptographic keys, among other data structures that facilitate processing. In another example, the performance of certain functions may be facilitated by storage of payload data in a memory. Conventional solutions for storage of these data structures and/or payload data may include the use of high cost external memory devices and/or inefficient high latency external devices.

The present application relates to the use of network processors with integrated low-latency memory devices. In some embodiments, the network processors may include multi-die single package systems (i.e., system in package (SiP)), having processor die coupled to a base die that includes memory. In SiP applications, a high-speed interface, which may be implemented using a 2.5D or a 3D interconnect, may be used to couple the processor die to the base die. The 3D interconnect may be a high-density interconnect (e.g., microbumps). In some embodiments, the network processors may include programmable logic fabric, which may allow dynamic reconfiguration of the network processor, as detailed below. In some embodiments, the network processors may include a general-purpose processor (e.g., a central processing unit (CPU), a graphical processing unit (GPU)) to perform network functions based on instructions stored in a memory. In some embodiments, the network processor may include application-specific integrated circuit (ASIC) that may implement hardened logic dedicated to perform the network functions.

As discussed herein, network processors and network processing systems refer, generally, to electronic devices that perform network functions over network packets or data streams and that network processors may be implemented using programmable logic circuitry, hardened logic circuitry, or general-purpose computing circuitry in any combination or arrangement. Moreover, while the application details certain embodiments that employ programmable logic fabric in its implementation, embodiments employing network processors implemented in hardened circuitry or application-specific integrated circuit (ASIC) and have access to low-latency large capacity on-package memory are also subject of this disclosure.

In some embodiments that employ programmable logic, the programmable logic die may be sectorized, as detailed below. In such systems, the fabric support circuitry in the base die may include network on chip (NOC) circuitry to exchange data (e.g., configuration data, user data) with systems external to the programmable device and/or with sectors in the programmable devices. The fabric support circuitry may also include sector-aligned memory. In some embodiments, the sector-aligned memory may operate as a temporary storage (e.g., cache) for the configuration data or user memory. By incorporating the NOC into the fabric support circuitry, the NOC may improve the performance of the shoreline bandwidth of the fabric, while increasing the bandwidth of the fabric. In addition, the communication routes available via the NOC embedded in the fabric support circuitry may enable the fabric to implement design relocations or reconfigurations, provide alternate pathways around powered-down sectors of the fabric, and provide security isolation features. The NOC may be a source of configuration data and/or fabric data and may be integrated to access the multi-purpose high-speed interface.

In addition to the above-described features, the fabric support circuitry may include, among other things, a device controller (sometimes referred to as a secure device manager (SDM)), a sector controller (sometimes referred to as a local sector manager (LSM), region controller), a configuration network on chip (CNOC), data routing circuitry, local (e.g., sectorized, sector-aligned, region-aligned) memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, California) or an interface to connect to a processor (e.g., an interface to an Intel® Xeon® processor by Intel Corporation of Santa Clara, California), voltage control circuitry, thermal monitoring circuitry, decoupling capacitors, power clamps, or electrostatic discharge circuitry, to name just a few circuit elements that may be present on the second die.

By way of introduction, FIG. 1 illustrates a block diagram of a system 10 that may employ a programmable logic device 12 that can communicate via a network-on-chip disposed on a separate die that does not include programmable logic fabric, in accordance with embodiments presented herein. Using the system 10, a designer may implement a circuit design functionality on an integrated circuit, such as a reconfigurable programmable logic device 12, such as a field programmable gate array (FPGA).

The designer may implement a circuit design to be programmed onto the programmable logic device 12 using design software 14, such as a version of Intel® Quartus® by Intel Corporation of Santa Clara, California. The design software 14 may use a compiler 16 to generate a low-level circuit-design defined by bitstream 18, sometimes known as a program object file and/or configuration program, which programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may include one or more network functions, as detailed below. The configuration program 20 may also include an accelerator function to perform machine learning functions, video processing functions, voice recognition functions, image recognition functions, or other highly specialized task.

To carry out the systems and methods of this disclosure, the programmable logic device 12 may take any suitable form that includes the multi-purpose high-speed parallel interface, which increases the speed of exchange of fabric data and/or configuration data across different portions (e.g., sectors, dies) of the programmable logic device 12. The multi-purpose parallel interface may also allow reconfiguration of portions of the programmable logic device 12 while concurrently operating a circuit design by allowing concurrent exchange of fabric data and configuration data through distinct microbump channels. As such, in one embodiment, the programmable logic device 12 may have two separate integrated circuit die coupled via the multi-purpose parallel interface. The integrated circuit dies may include controllers for the multi-purpose parallel interface, which may be hard coded circuitry, a soft IP block, and/or custom logic.

Figure 2:
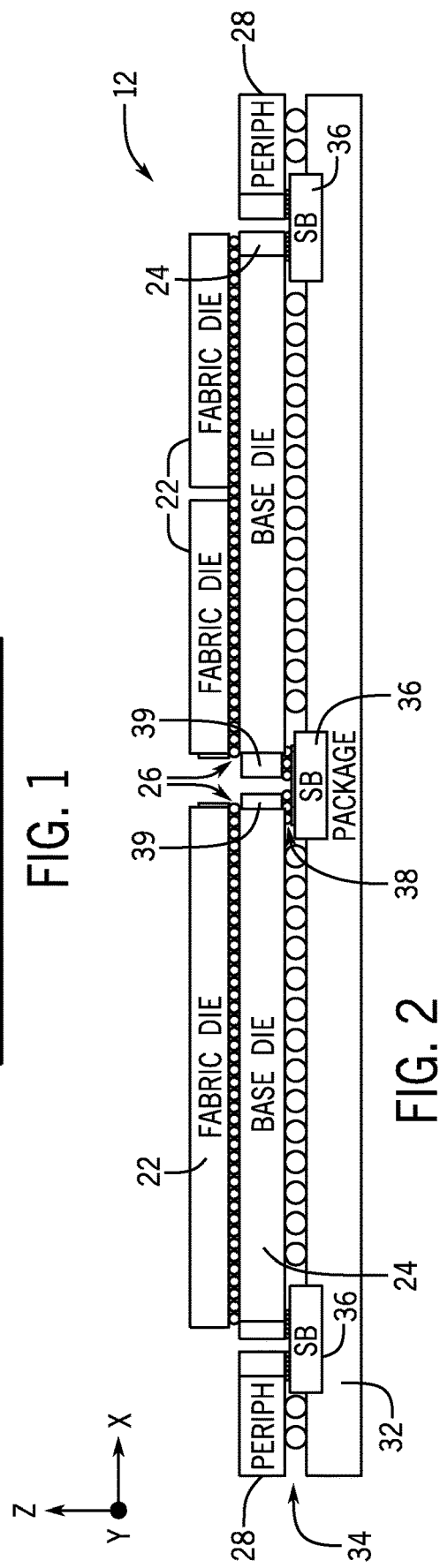
FIG. 2 is a block diagram of a package including the programmable logic device where a fabric die is vertically stacked with a base die having low latency memory, in accordance with an embodiment.

One example of the programmable logic device 12 is shown in FIG. 2, but any suitable programmable logic device may be used. In the example of FIG. 2, the programmable logic device 12 includes a fabric die 22 and a base die 24 that are connected to one another via microbumps 26. The microbumps 26 may couple an interface in the fabric die 22 to an interface in the base die 24. The microbumps 26 may provide a high-speed interface for exchanging data for network processing functions and/or for dynamic reprogramming of the network processor, as detailed below. In the illustrated diagram of FIG. 2, the fabric die 22 and the base die 24 are illustrated in a one-to-one relationship and in an arrangement in which a single base die 24 may attach to several fabric die 22. Other arrangements, such as an arrangement in which several base die 24 may attach to a single fabric die 22, or several base die 24 may attach to several fabric die 22 (e.g., in an interleaved pattern along the x- and/or y-direction) may also be used. Peripheral circuitry 28 may be attached to, embedded within, and/or disposed on top of the base die 24. The base die 24 may attach to a package substrate 32 via C4 bumps 34. In the example of FIG. 2, two pairs of fabric die 22 and base die 24 are shown communicatively connected to one another via a silicon bridge 36 and via microbumps 38 at a silicon bridge interface 39.

Although the microbumps 26 and the microbumps 38 are described as being employed between the fabric die 22 and the base die 24 or between the edge devices, such as the silicon bridge 36 and the silicon bridge interface 39, it should be noted that microbumps may be employed at any suitable position between the components of the programmable logic device 12. For example, the microbumps may be incorporated in any suitable position (e.g., middle, edge, diagonal) between the fabric die 22 and the base die 24. In the same manner, the microbumps may be incorporated in any suitable pattern or amorphous shape to facilitate interconnectivity between various components (e.g., NOC) described herein.

Figure 3:
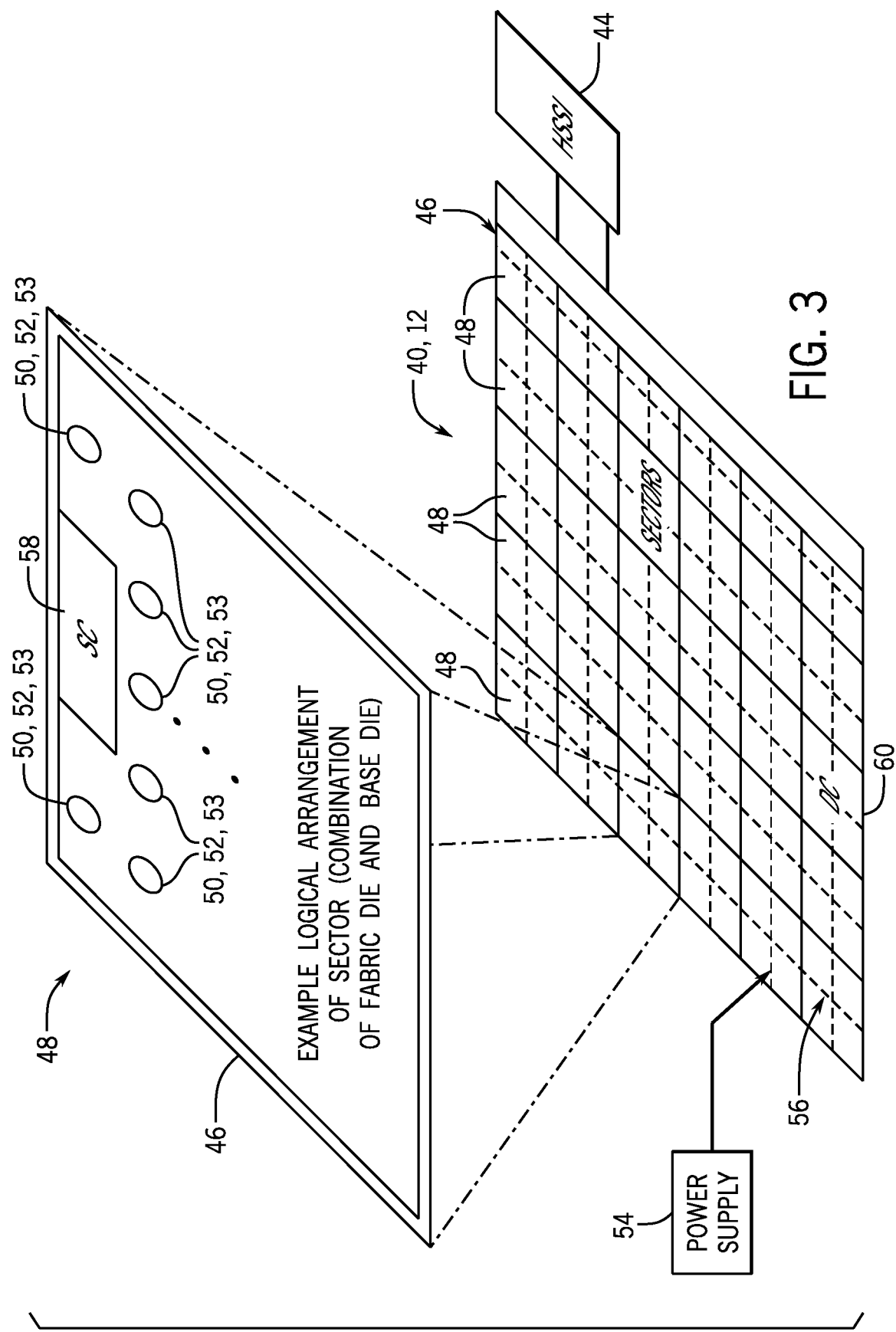
FIG. 3 is a block diagram of an example logical arrangement of the programmable logic device of FIG. 2, in accordance with an embodiment.

In combination, the fabric die 22 and base die 24 may operate as a programmable logic device such as a field programmable gate array (FPGA) device. For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when both the fabric die 22 and the base die 24 operate in combination. That is, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as a FPGA, though it should be understood that the device may be any suitable type of programmable logic device (e.g., an application-specific integrated circuit and/or application-specific standard product).

In the example of FIG. 3, the FPGA 40 may include transceiver circuitry 44 for driving signals off of the FPGA 40 and for receiving signals from other devices. The transceiver circuitry 44 may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48 (e.g., region, portion).

Each programmable logic sector 48 may include a number of programmable logic elements 50 (also referred herein as FPGA fabric) having operations defined by configuration memory 52 (e.g., configuration random access memory (CRAM)). The programmable logic elements 50 may include combinatorial or sequential logic circuitry. For example, the programmable logic elements 50 may include look-up tables, registers, multiplexers, routing wires, and so forth. A designer may program the programmable logic elements 50 to perform a variety of desired functions, including network processor functions. The programmable logic sector 48 may also include user memory 53. User memory may be in the form of embedded random access memory (ERAM), and/or memory blocks, such as M20K. A power supply 54 may provide a source of voltage and current to a power distribution network 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while the illustrated system includes 29 programmable logic sectors 48 are shown here, it should be appreciated that more or fewer may appear in an actual implementation (e.g., in some cases, on the order of 50, 100, or 1000 sectors or more). Each programmable logic sector 48 may include a sector controller 58 that controls the operation of the programmable logic sector 48. Each sector controller 58 may be in communication with a device controller 60. Each sector controller 58 may accept commands and data from the device controller 60 and may read data from and write data into its configuration memory 52 or user memory 53 based on control signals from the device controller 60. To that end and, as detailed below, the device controller may employ a data register (DR) and/or an address register (AR) to access data from the configuration memory 52 or user memory 53.

In addition to these operations, the sector controller 58 and/or device controller 60 may be augmented with additional capabilities. As described herein, a high-speed parallel interface may be used to coordinating memory transactions between local in-fabric memory (e.g., local fabric memory or CRAM being used for data storage) and sector-aligned memory associated with that particular programmable logic sector 48. Moreover, a NOC may be used to facilitate memory transactions between multiple sectors, multiple dies, and between the programmable logic device and external systems, as discussed herein. The NOC may further be employed for decrypting configuration data (bitstreams) 18, and for locally sequencing reads and writes to implement error detection and correction on the configuration memory 52 or user memory 53, and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes," and the local controller may be placed into any of those modes.

When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58. Each sector controller 58 thus may communicate with the device controller 60, which may coordinate the operations of the sector controllers 58 and convey commands initiated from outside the FPGA 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable logic elements 50 may include one or more logic elements (wires, gates, registers, etc.). For example, during programming, configuration data is loaded into the configuration memory 52 using the transceiver circuitry 44. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 of the FPGA 40. The configuration memory 52 may provide a corresponding static control output signal that controls the state of an associated programmable logic element 50 or programmable component of the interconnection resources 46. The output signals of the configuration memory 52 may be applied to configure the gates of metal-oxide-semiconductor (MOS) transistors that control the states of the programmable logic elements 50 or programmable components of the interconnection resources 46.

Figure 4:
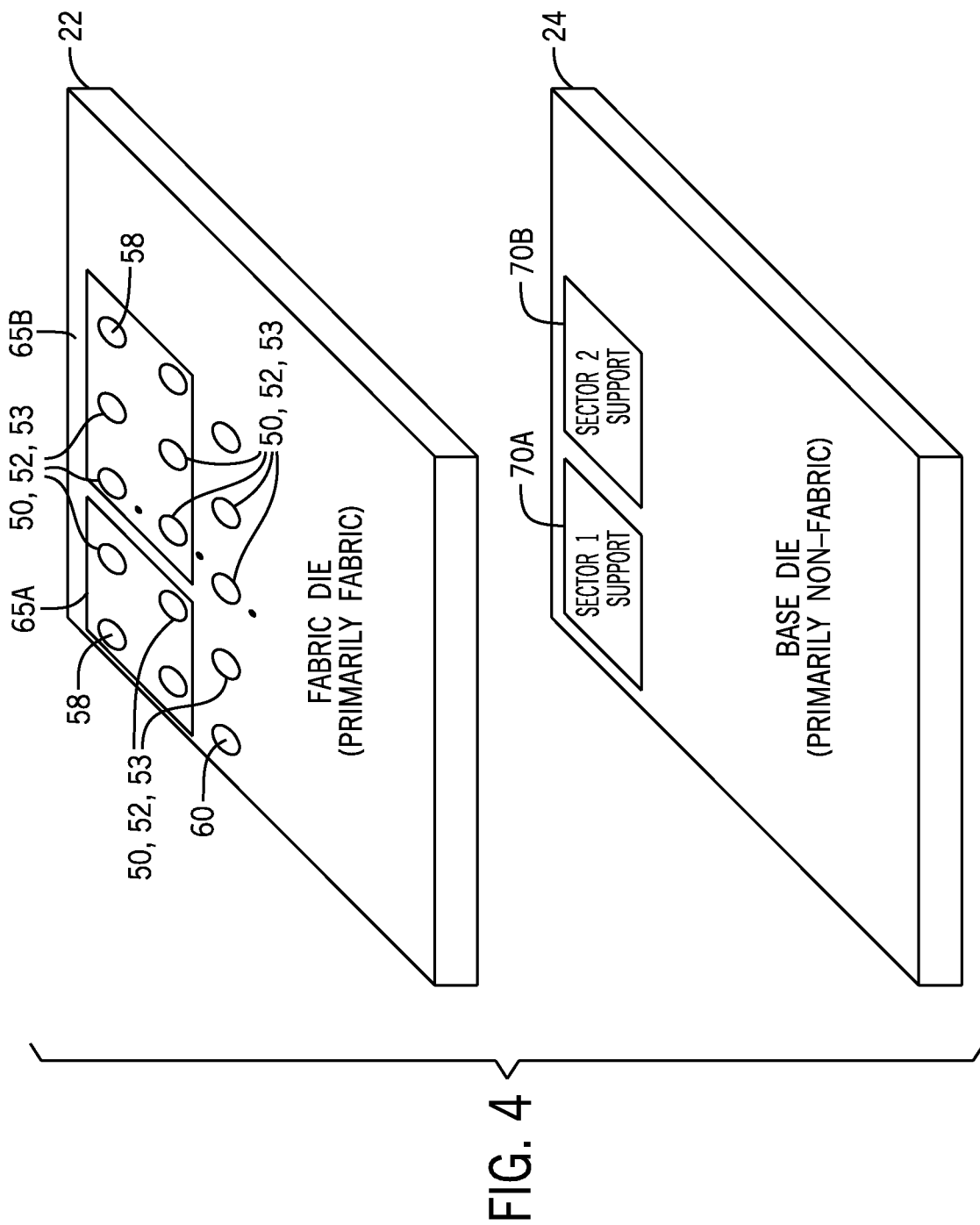
FIG. 4 is a block diagram showing a fabric die of the programmable logic device that contains programmable logic fabric with embedded memory and a base die of the programmable logic device that contains low latency memory to support operations of the fabric die, in accordance with an embodiment.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50, configuration memory 52, and user memory 53. The programmable logic fabric resources may be arranged in sectors, such as fabric sectors 65A and 65B. In some cases, this may also entail certain fabric control circuitry such as the sector controller 58 or device controller 60. The base die 24 may include supporting circuitry to operate the programmable logic elements 50, configuration memory 52, and user memory 53. As an example, the programmable logic elements 50 may exchange fabric data with the supporting circuitry in the base die 24 and configuration memory may exchange configuration data with the supporting circuitry in the base die 24. As shown here, the base die 24 includes support circuitry 70A, which may support fabric sector 65A, and support circuitry 70B, which may support fabric sector 65B. The base die 24 may also include support circuitry for other sectors of the fabric die 22.

Figure 5:
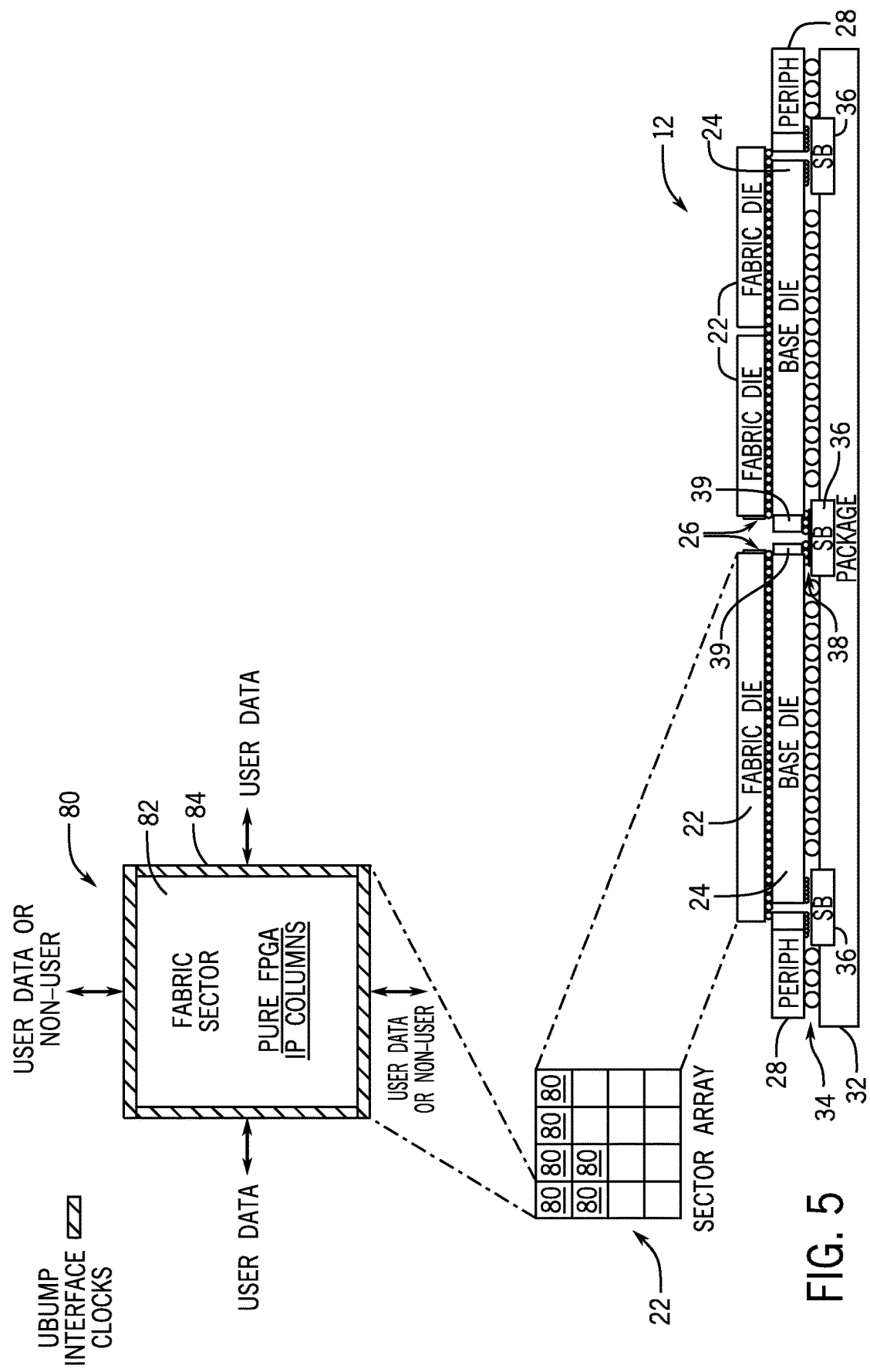
FIG. 5 is a block diagram of an example topology for the fabric die in the package of FIG. 2 in accordance with an embodiment.
Figure 6:
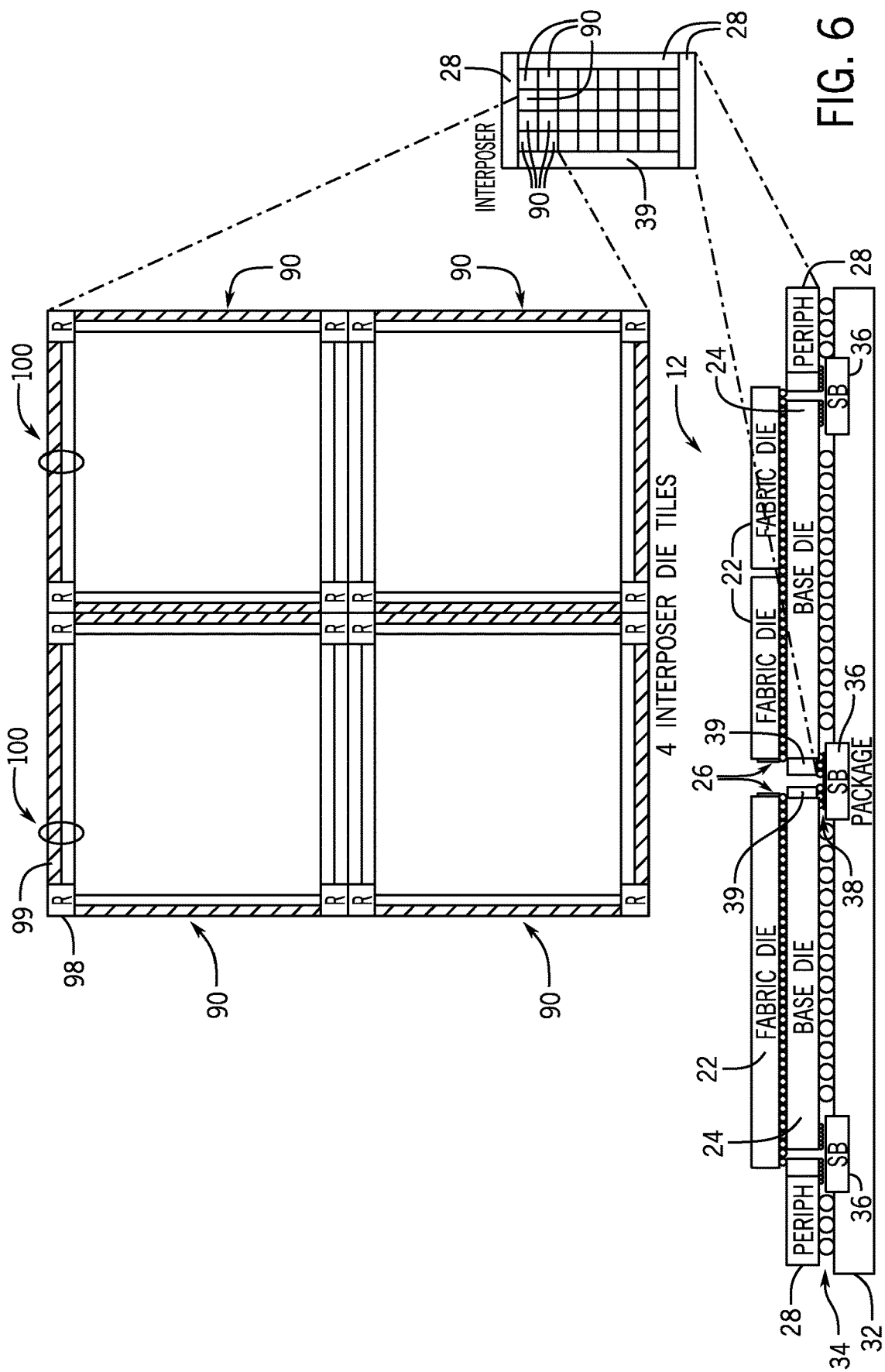
FIG. 6 is a block diagram of an example topology of the base die in the package of FIG. 2, in accordance with an embodiment.

As discussed above, the multi-purpose interface may benefit from the presence of NOC circuitry in the base die (e.g., base die 24). The block diagrams in FIGS. 5, 6, 7, and 8 illustrate an example of a physical arrangement of the fabric die 22 and the base die 24 that may implement a NOC system. For example, a physical arrangement of the fabric die 22 and the base die 24 is shown by FIGS. 5 and 6. In FIG. 5, the fabric die 22 is shown to contain an array of fabric sectors 80 that include fabric resources 82 (e.g., programmable elements programmed by CRAM and/or certain fabric control circuitry such as the sector controller 58 or device controller 60) and interface circuitry 84. The interface circuitry 84 may include data routing and/or clocking resources or may include an interface to data routing and/or clocking resources on the base die 24. Thus, the interface circuitry 84 may connect with a microbump (ubump) interface to connect to the base die 24.

FIG. 6 provides an example complementary arrangement of the base die 24. The base die 24 may represent an active interposer with several sectors 90 surrounded by peripheral circuitry 28 and the silicon bridge interface 39. The base die 24, in some embodiments, may include data and/or configuration routers 98, and/or data or configuration pathways 99. In some embodiments, portions of the data or configuration pathways 99 may communicate data in one direction, while other portions may communicate data in the opposite direction. In other embodiments, the data or configuration pathways 99 may communicate data bi-directionally.

With the foregoing in mind, the data and/or configuration pathways 99 may make up a network on chip (NOC) system 100. In the embodiment depicted in FIG. 6, the NOC system 100 may be integrated between each sector 90 of the base die 24. As such, the NOC system 100 may enable each of the sectors 90 disposed on the base die 24 to be accessible to each other. Indeed, the NOC system 100 may provide communication paths between each sector 90 via routers 98 or the like. In certain embodiments, the routers 98 may route user data between sectors 90 of the base die 24, to sectors 48 of the fabric die 22, and the like. Since the base die 24 is separate from the fabric die 22, the NOC system 100 may be continuously powered on, even when various sectors 48 of the fabric die 22 are powered down. In this way, the NOC system 100 of the base die 24 may provide an available route to different sectors 48 of the fabric die 22 regardless of the positions of powered down sectors 48.

In some embodiments, the NOC system 100 may include features such as Quality of Service management, Security Management, Debug and Performance measurement and Address virtualization services, and the like. In addition, the NOC system 100 may support caching features and interconnect protocols allowing the memory components of the programmable logic device 12 to be part of a coherent memory system supported by a caching agent.

By vertically aligning the fabric die 22 and the base die 24, the NOC 100 disposed on the base die 24 may physically span across the same surface area of the fabric die 22. In certain embodiments, microbumps may be positioned at various locations between the base die 24 and the fabric die 22 to enable the NOC 100 to communicate data between sectors 90 of the base die and sectors 48 of the fabric die 22. In the example embodiment of the NOC 100 depicted in FIG. 6, the NOC 100 may be positioned around each sector 90, which may be aligned with a corresponding sector 48 of the fabric die 22. As such, the NOC 100 may provide additional horizontal and vertical routing wires or pathways to facilitate communication between sectors 48 of the fabric die 22, between sectors 90 of the base die 24, or between sectors 48 of the fabric die 22 and sectors 90 of the base die 24. The additional horizontal and vertical lines provided by the NOC 100 may reduce the amount of quantization performed by the programmable logic device 12.

Figure 7:
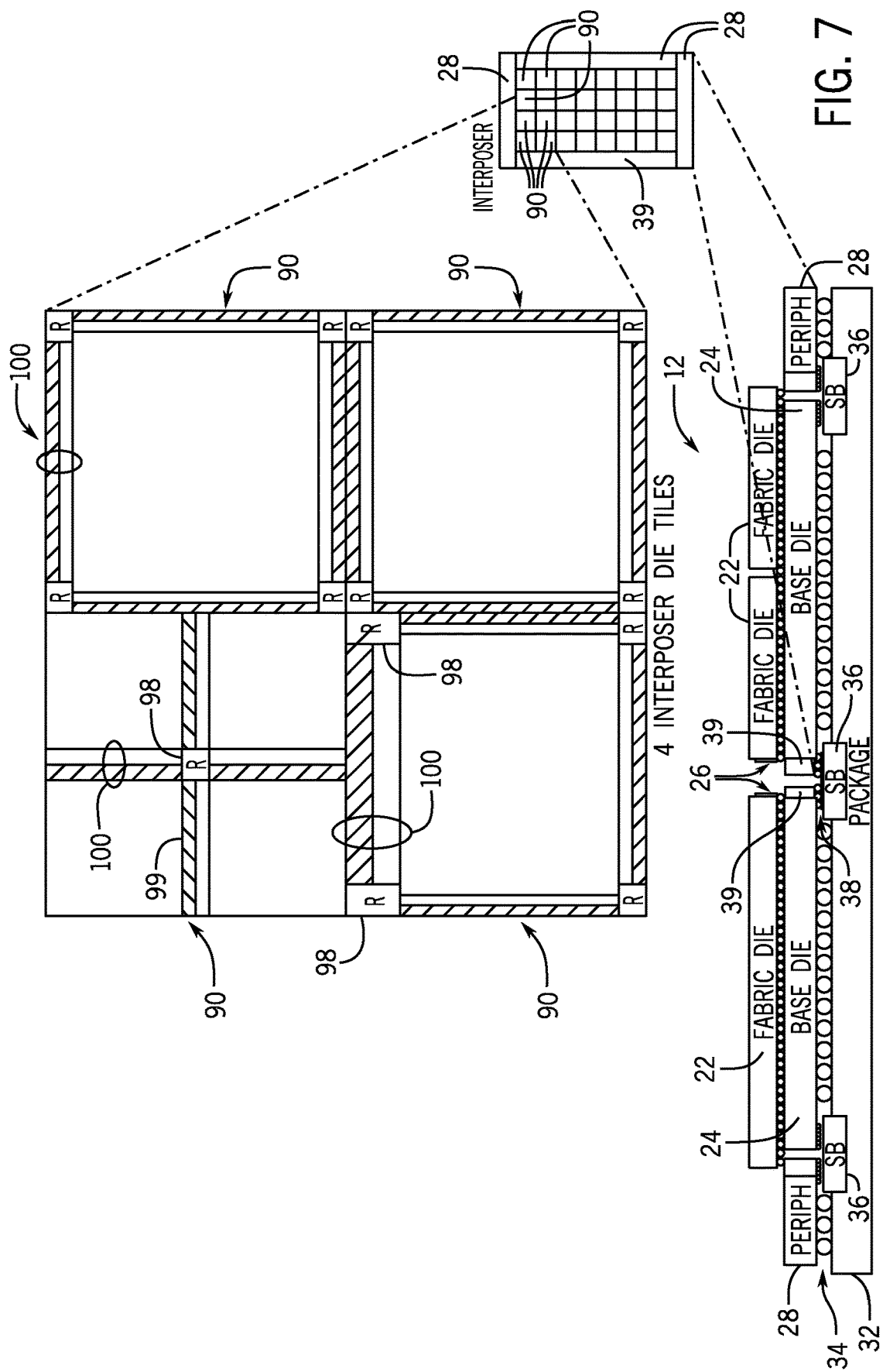
FIG. 7 is a block diagram of an example topology of the base die in the package of FIG. 2, in accordance with an embodiment.

Although the data or configuration pathways 99 of the NOC 100 is illustrated in FIG. 6 as being routed around the sectors 90 of the base die 24, it should be noted that data or configuration pathways 99 of the NOC 100 may be routed across the base die 24 in any suitable manner. By way of example, FIG. 7 illustrates the NOC 100 implemented with data or configuration pathways 99 disposed across the center of the sector 90. As such, the router 98 may also be positioned in the center of the sector 90.

In addition, in some embodiments, the data or configuration pathways 99 of the NOC 100 may be wider in certain sectors 90 as compared to other sectors 90. In any case, it should be understood that the data or configuration pathways 99 may be incorporated into the base die 24, such that serve desired functions or operations that may be specific to the operations performed by the programmable logic device 12. That is, if the programmable logic device 12 includes functions that involve regularly transferring data across the fabric die 22, it may be beneficial to use more of the base die 24 space to include data or configuration pathways 99 that take up more space on the base die 24 to provide increased bandwidth.

With the foregoing in mind, the NOC system 100 may include the data or configuration pathways 99 that allow for efficient multi-dimensional (e.g., three-dimensional, two-dimensional) integration of the NOC system 100 on the programmable logic device 12. Indeed, the NOC system 100 may enable the fabric die 22 to connect to the peripheral circuitry 28 and other parts of the fabric without communicating via the fabric die 22 or the programmable logic sectors 48 of the fabric die 22. That is, by employing the NOC system 100 in the base die 24, the programmable logic device 12 may increase the available bandwidth for communication across the programmable logic sectors 48 because the NOC system 100 provides additional pathways to different parts of the programmable logic device 12.

Figure 9:
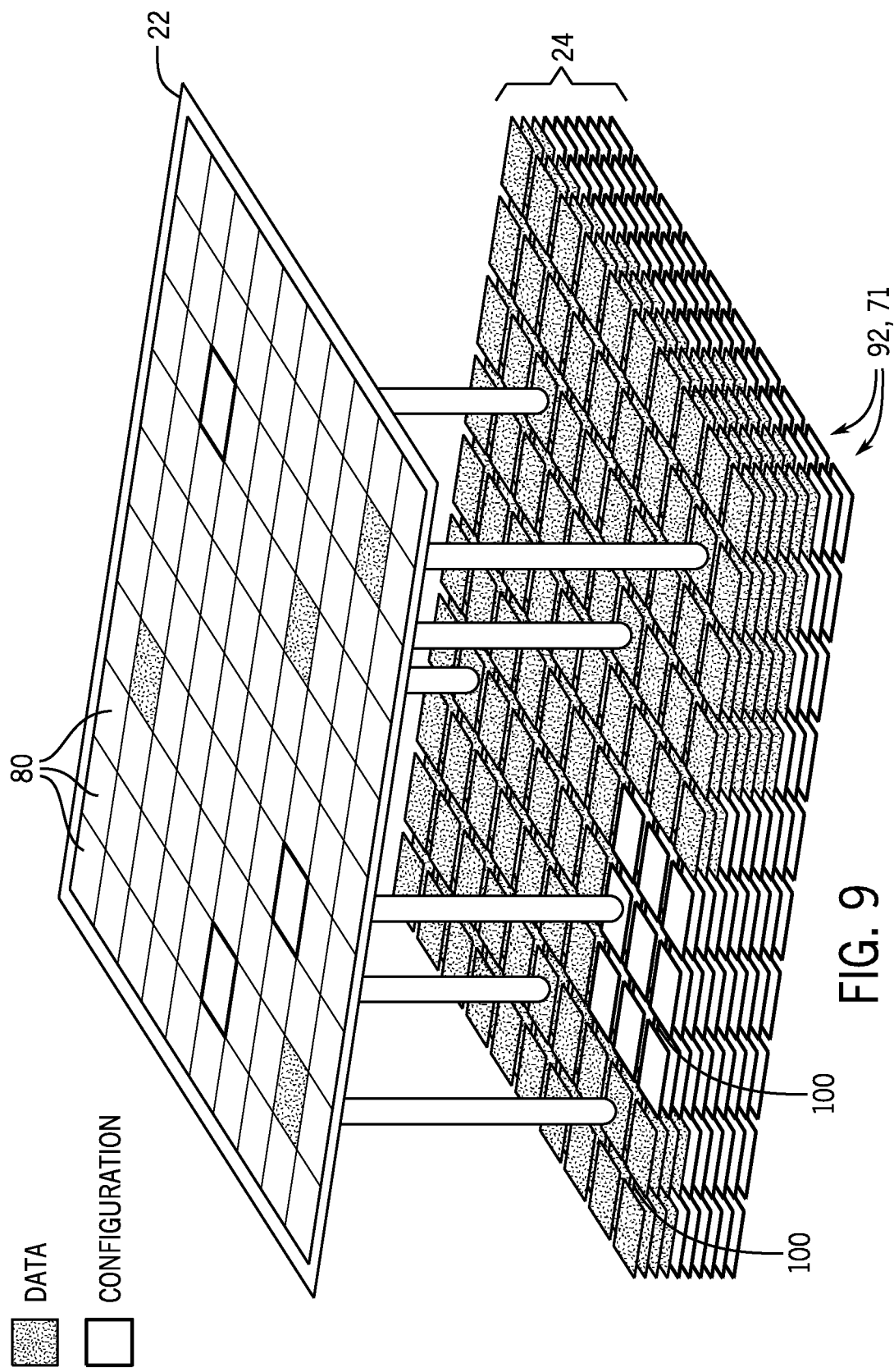
FIG. 9 is a schematic block diagram of the programmable device of FIG. 2 having embedded network on chip (NOC) circuitry integrated with a sector-aligned memory, in accordance with an embodiment.

In addition, the NOC 100 resolves shoreline issues, supports fast reconfiguration, and enables relocate-ability of functions in the programmable logic sectors 48 based on the increased bandwidth and accessibility to different portions of the fabric die 22 via the base die 24. That is, as shown in FIG. 9, the NOC system 100 may be integrated with the sector-aligned memory 92 of the base die 24, such that it spans across the entire base die 24. As such, the NOC system 100 may access different fabric sectors 80 through various routes in the base die 24. In addition, the additional routes enable the NOC system 100 to serve as functional bypass around powered down sectors 80 without affecting the performance of the programmable logic device 12 by avoiding blockages across the programmable logic sectors 48 of the programmable logic device 12. That is, in some situations, certain sectors 80 of the fabric die 22 may be powered down, thereby preventing communication across the powered down sectors 80. In this case, the NOC system 100 may provide alternate communication pathways around the powered down sectors 80 to maintain communicative connectedness across the sectors 80 of the fabric die 22 regardless of whether certain sectors 80 are powered down.

The design relocate-ability of the programmable logic sectors 48 is also enhanced by the NOC system 100 because the NOC system 100 may access different sectors 80 of the fabric die 22. That is, the increased communication flexibility provided by the NOC system 100 being disposed in the base die 24 enables the programmable logic sectors 48 to be repositioned in various sectors 80 of the fabric die 22, while maintaining communication capabilities between the relocated programmable logic sectors 48.

Although FIGS. 6 and 7 illustrate two embodiments with different configurations for the NOC 100, it should be noted that the base die 24 may be configured to include a data or configuration pathways 99 in a variety of shapes, forms, positions, and the like. For example, the data or configuration pathways 99 of different sectors 90 may overlap each other or the entire sector 90 may incorporate the data or configuration pathway 99, or any other similar arrangement may be contemplated . . . . In addition, microbumps may be used to facilitate communication between the NOC 100 and various sectors 80 of the fabric die 22 and the like.

Figure 8:
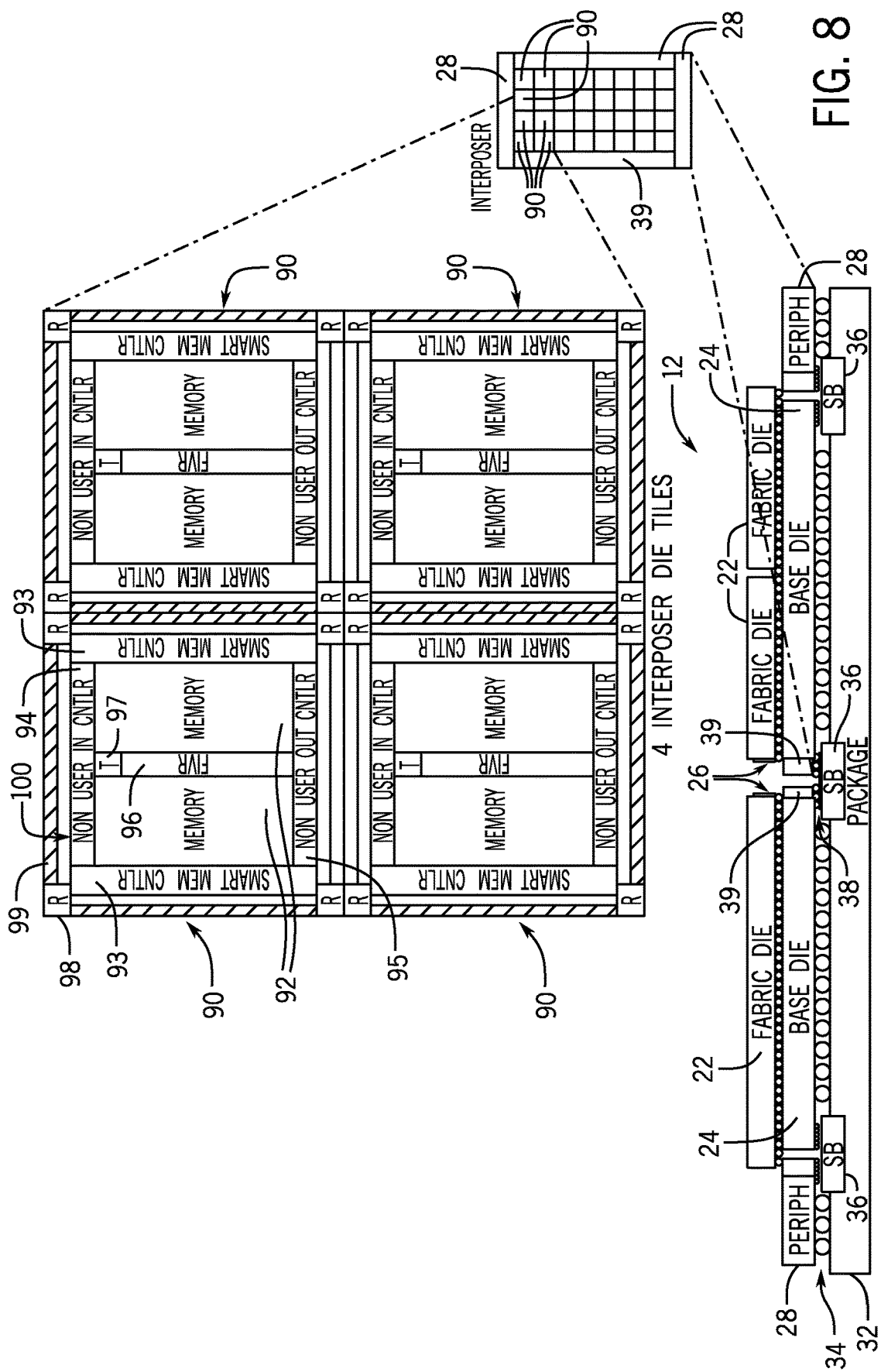
FIG. 8 is a block diagram of an example topology of the base die in the package of FIG. 2, in accordance with an embodiment.

In addition to facilitating communication of data between sectors 90, sectors 80, and the like, the presence of the NOC 100 in the base die 24 may also provide the programmable logic device 12 to incorporate additional circuit features by leveraging the NOC 100 of the base die 24 to improve the communication across the fabric die 22. By way of example, FIG. 8 provides another embodiment of an arrangement of the base die 24. Similar to the base die 24 described above, the base die 24 of FIG. 8 may represent an active interposer with several sectors 90 surrounded by peripheral circuitry 28 and the silicon bridge interface 39. As shown in FIG. 8, each sector 90 may include a variety of fabric support circuitry, such as sector-aligned memory 92, memory control circuitry 93, non-user input control circuitry 94, non-user output control circuitry 95, a voltage regulator such as a fully integrated voltage regulator (FIVR) 96, one or more thermal sensors 97, data and configuration routers 98, and/or data or configuration pathways 99.

Although the following description of the additional circuit features enabled by the NOC 100 embedded in the base die 24 focuses on the ability to transfer data to and from the sector-aligned memory 92, it should be noted that the additional circuit features are not limited to technologies involving the sector-aligned memory 92. Indeed, the NOC 100 embedded in the base die 24 may enable a variety of circuit operations to be performed more efficiently and effectively via the programmable logic device 12. However, for the purposes of discussion, certain operations that involve the sector-aligned memory 92 and the NOC 100 will be described to illustrate some of the functions enabled by incorporating the NOC 100 into the base die 24.

Referring back to FIG. 8, the memory control circuitry 93 may be used to program the sector-aligned memory 92, the CRAM of the fabric die 22, or both. The non-user input control circuitry 94 and non-user output control circuitry 95 may allow the circuitry of the sectors 90 to exchange data and/or control signals (e.g., via configurable data routing network-on-chip (NOC) or a configuration network on chip (CNOC)). In one example, the non-user input control circuitry 94 and non-user output control circuitry 95 may operate as the sector controller 58 for a corresponding fabric sector 80 (as shown in FIG. 5).

In certain embodiments, the data or configuration pathways 99 that make up the NOC system 100 may provide communication paths between each sector 90 via routers 98 mentioned above. As shown in FIG. 9, by vertically aligning the fabric die 22 and the base die 24 and incorporating the NOC 100 in the base die 24, memory located in the base die 24 may be accessible in parallel to fabric sectors 80 of the fabric die 22. FIG. 9 shows an example in which sector-aligned memory 92 may be contained in the base die 24. The sector-aligned memory 92 may be directly accessible to respective fabric sectors 80 of the fabric die 22 and may contain user data (generated by or accessible by a circuit design programmed into the programmable logic fabric of the base die 24) or configuration data that may be used to program the programmable logic fabric of the base die 24. In this disclosure, "directly accessible" refers to a connection between a region of the sector-aligned memory 92, associated with a particular fabric sector 80, and that particular fabric sector 80. In some embodiments, each respective region of the sector-aligned memory 92 associated with a particular fabric sector 80 may be directly accessible to that particular fabric sector 80, thereby providing each fabric sector 80 with direct access to that region of the sector-aligned memory 92. For example, there may be N regions of sector-aligned memory 92 that can be accessible by N corresponding fabric sectors 80 at the same time (e.g., in parallel). In some cases, the sector-aligned memory 92 may be accessible to more than one fabric sector 80 or multiple sectors of sector-aligned memory 92 may be accessible to a single fabric sector 80. Thus, in some cases, the same region of sector-aligned memory 92 may be directly accessible to multiple fabric sectors 80, while in other cases, a region of sector-aligned memory 92 may be directly accessible only to a single fabric sector 80. In the example of FIG. 9, the fabric sectors 80 may access specific regions of sector-aligned memory 92. The sector-aligned memory 92 is shown in FIG. 9 as vertically stacked memory. This may allow a large amount of memory to be located within the base die 24. However, the sector-aligned memory 92 may occupy a single plane of the base die 24 in some embodiments.

It should be noted that the fabric sectors 80 may initiate a transfer of data directly between memory locations of the sector-aligned memory 92 of the base die 24 using the NOC 100, between different fabric sectors 80 of the fabric die 22, between fabric sectors 80 and memory locations of the sector-aligned memory 92, and the like. In certain embodiments, the sector controller 58 may initiate the transfer of data between sectors 80 of the fabric die 22, between memory locations of the sector-aligned memory 92, between sectors 80 of the fabric die 22 and memory locations of the sector-aligned memory 92, and the like. That is, the sector controller 58 may coordinate the operation of the NOC 100 to facilitate the transfer of the data between the source and destination targets, as specified by the sector controller 58. In some embodiments, the sector controller 58 may act as a master to initiate the respective transfer and the transfer would then be performed using the NOC 100 after the sector controller 58 initiates the data transfer process.

Figure 10:
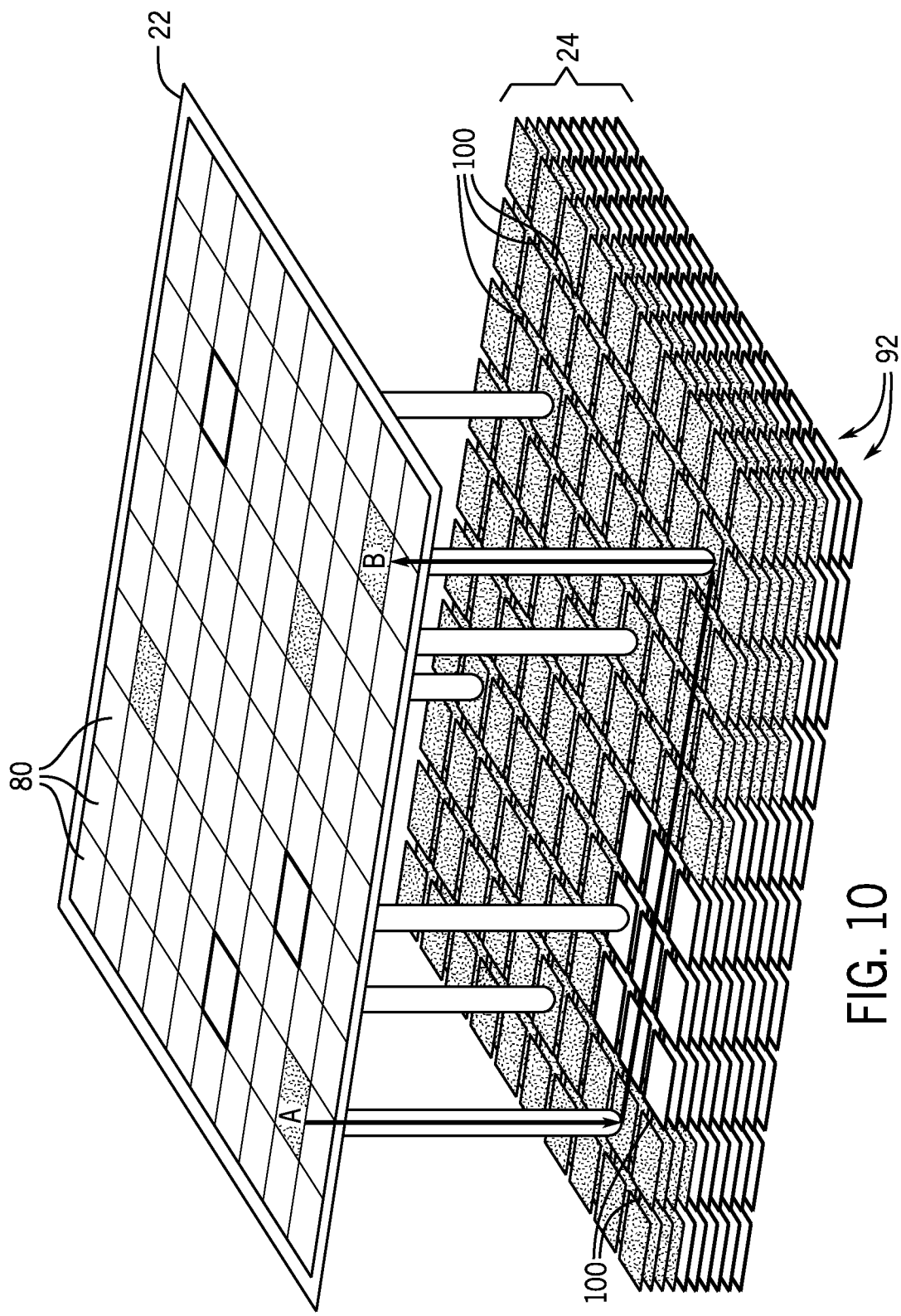
FIG. 10 is an example of data transfer between sectors of the programmable logic fabric using the system of FIG. 9 that may be used for network applications, in accordance with an embodiment.

By way of example, FIG. 10 includes a block diagram of illustrating the transfer of data between sectors 80 of the programmable logic fabric via the NOC system 100 of the base die 24. Referring to FIG. 10, in one embodiment, the sector controller 58 may initiate a transfer of data from sector "A" to sector "B" of the fabric die 22 using the NOC 100 of the base die 24. That is, the sector controller 58 may transfer data to a region of the sector-aligned memory 92 aligned with sector "A" of the fabric die 22, use the NOC 100 to transfer the data to a second region of the sector-aligned memory 92 aligned with sector "B" of the fabric die 22, and transfer the data from the second region of the sector-aligned memory 92 to sector "B" of the fabric die 22. Although the route of the data transfer illustrated in FIG. 10 corresponds to straight paths, it should be noted that the data transferred to different sectors 80 of the fabric die 22 or regions of the sector-aligned memory 92 may use a variety of directions and routes.

Figure 11:
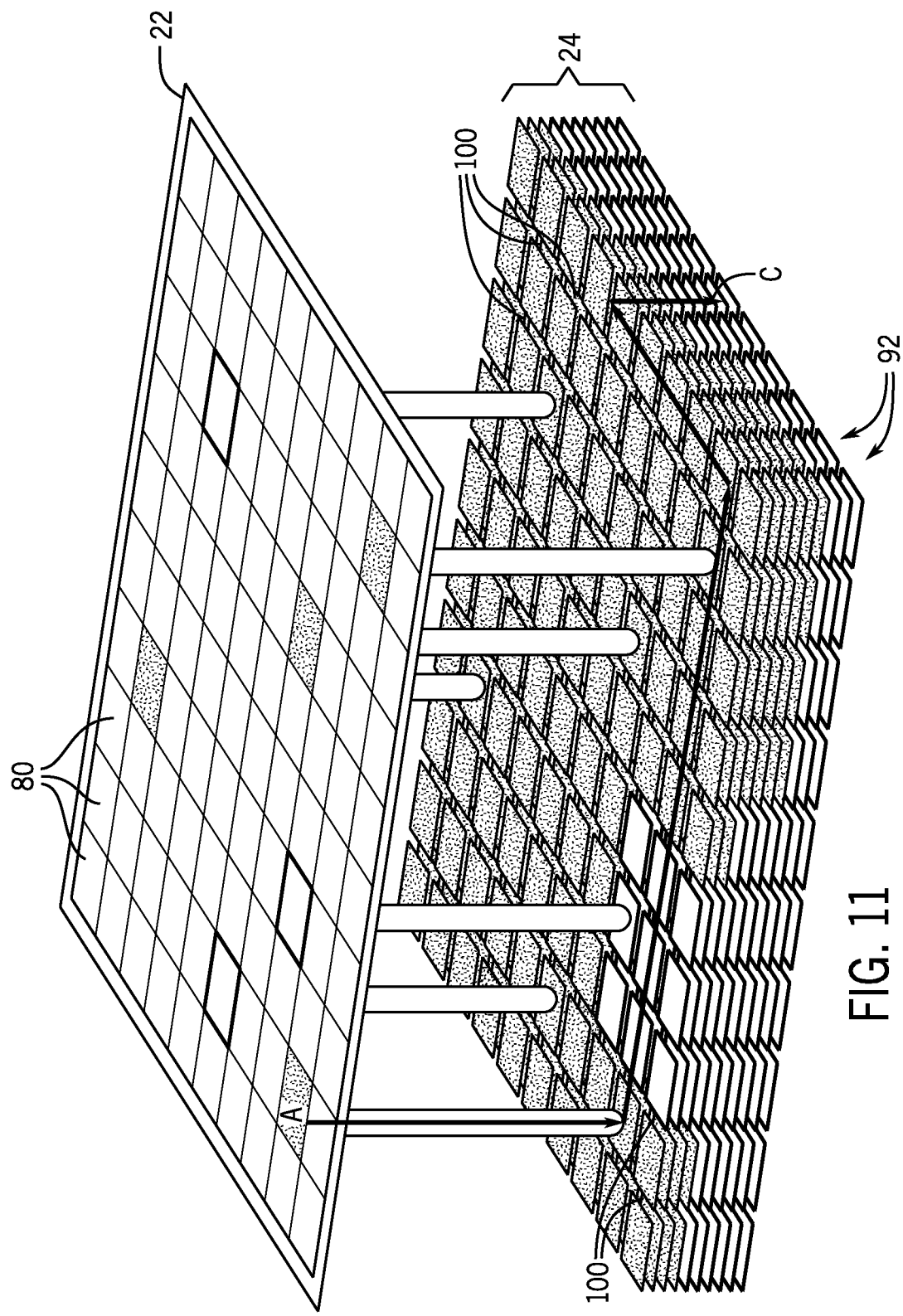
FIG. 11 is an example of data transfer from a sector of the programmable logic fabric to a memory of the sector-aligned memory using the system of FIG. 9 that may be used for network applications, in accordance with an embodiment.

In another example, FIG. 11 includes a block diagram illustrating the transfer of data from a sector 80 of the programmable logic fabric to a region of the sector-aligned memory 92 via the NOC system 100 of the base die 24. Referring to FIG. 11, in one embodiment, the sector controller 58 may initiate a transfer of data from sector "A" of the fabric die 22 to region "C" of the sector-aligned memory 92 using the NOC 100 of the base die 24. That is, the sector controller 58 may transfer data to a first region of the sector-aligned memory 92 aligned with sector "A" of the fabric die 22 and use the NOC 100 to transfer the data to region "C" of the sector-aligned memory 92 via different regions of the sector-aligned memory 92 or the like. Like FIG. 10, although the route of the data transfer illustrated in FIG. 11 corresponds to straight paths, it should be noted that the data transferred to different regions of the sector-aligned memory 92 may use a variety of directions and routes. It should be noted that other suitable circuits may also be employed to transfer the data in accordance with the embodiments presented herein.

As shown in FIGS. 10 and 11, the sector controller 58 may initiate a transfer of data directly between memory locations within the base die 24 using the NOC system 100. In this case, the sector controller 58 may act as the master to initiate the transfer, but then the transfers would be performed directly in the sector-aligned memory 92 and the NOC system 100 of the base die 24 after the sector controller 58 initiates the transfer. It should also be mentioned that, in some embodiments, that the sector controller 58 and similar components of the fabric die 22 may also initiate the components (e.g., memory control circuitry 93, non-user input control circuitry 94, non-user output control circuitry 95) of the base die 24 to perform transfers between the sector-aligned memory 92, the peripheral circuitry 28, and other components attached to the base die. As a result, data transfers may occur in the base die 24 without involvement of components in the fabric die 22.

In certain embodiments, the NOC system 100 may also enable the programmable logic device 12 to provide security isolation for one or more of the programmable logic sectors 48. That is, the NOC system 100 may be employed to communicate certain sensitive or secure data to a portion of programmable logic sectors 48 that may be designated as a security portion of the programmable logic device 12. Third party programmers may be unable to access the security portion of the programmable logic device 12 without access to the NOC system 100. Instead, the NOC system 100 may be limited to communication by certain programmers with a level of security credentials.

Figure 12:
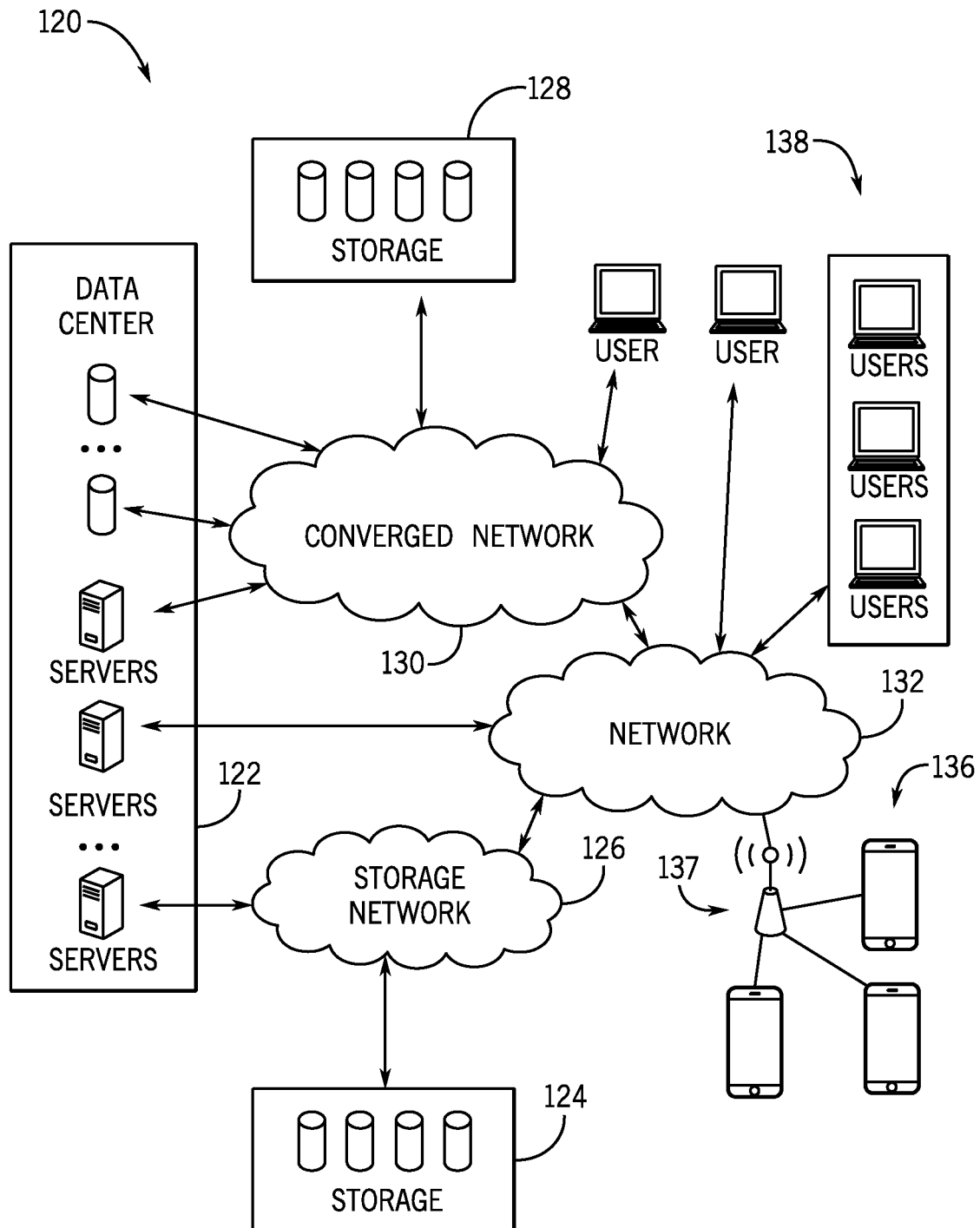
FIG. 12 is a diagram of a networked system that may benefit from programmable logic device with low-latency memory, in accordance with an embodiment.

FIG. 12 illustrates an example of a network system 120 that may employ network devices using one or more multi-die packaged, packet processing systems described herein. Network system 120 may include a data center 122 and/or a storage center 124 that may be connected to the data center 122 through a storage network (e.g., Fibre Channel network). The network system 120 may also include a storage center 128, which may be connected to the data center 122 through a converged network 130 (e.g., ROCE, RDMA over Infiniband). The data center 122 and/or the storage centers 124 and 128 may be connected to a network 132 (e.g., Ethernet, SONET, wide area network (WAN), local area network (LAN)). The applications and/or services provided by the data center 122 may be accessed by remote users 136 via the network 132 and/or a wireless portal 137, or by networked users 138 via the network 132. Examples of applications and services provided by the network system 120 include artificial intelligence expert systems, data analysis applications, end-user cellular applications, gaming servers, software-as-a-service platforms, content portals, entertainment content providers, and social networking platforms, among others.

The data center 122, storage centers 124 and 128, and the networks 126, 130, and 132 may employ one or more network devices that implements packet processing functionality. For example, switches, routers, and network interface cards (NICs) may perform packet routing, quality of service (QOS) functionality queueing, packet integrity checking (e.g., cyclic redundancy checking (CRC) or checksums), encryption or decryption, timestamping, and buffering. Furthermore, devices may be connected to or be a part of computer systems that implement virtualization and, thus, the network devices may employ virtualization managers to facilitate its activity. In many embodiments, the functionality may be implemented by dedicated hardware (e.g., ASICs, FPGAs) in multi-die packaging, such as the ones illustrated above. Such systems may employ the sector-aligned memory (e.g., sector-aligned memory 92) as a low-latency memory/high-capacity memory for temporary storage of packet data (e.g., packet headers, packet payloads) and/or storage of data structures associated with the functionality (e.g., lookup tables, encryption keys, QoS queues).

Figure 13:
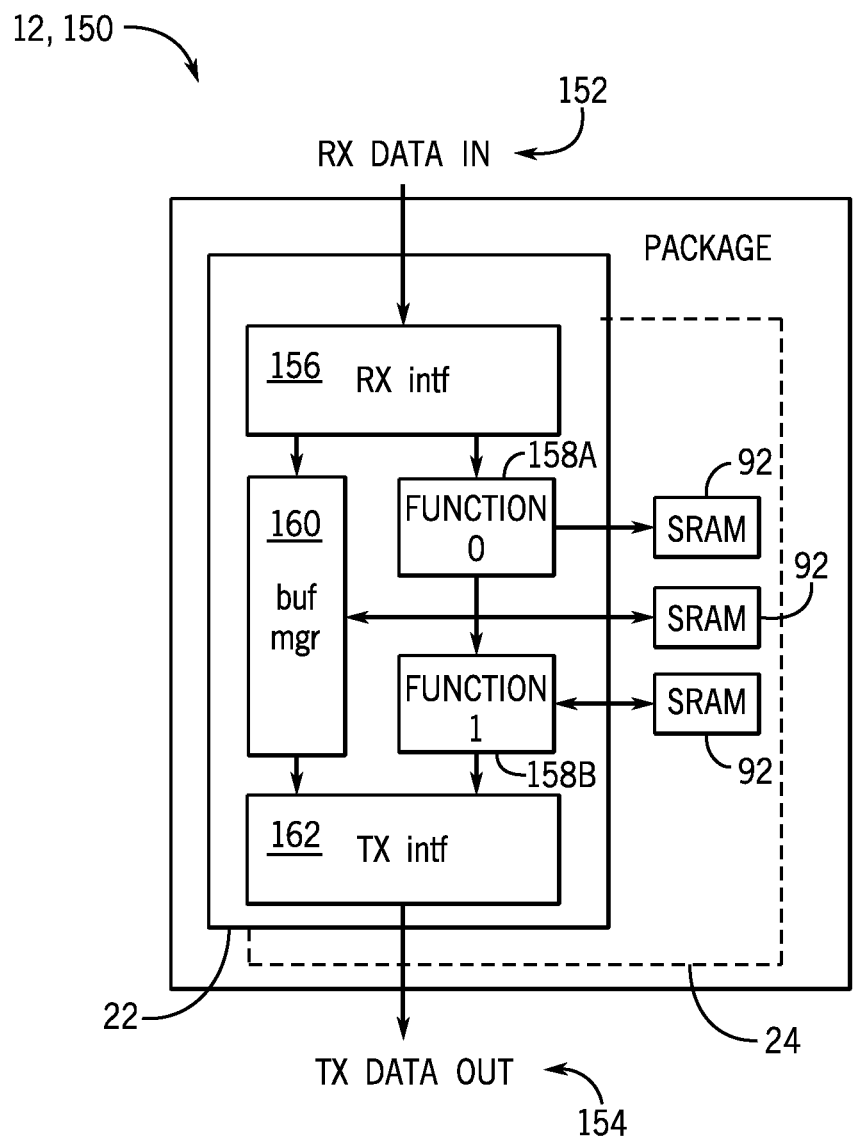
FIG. 13 is a diagram of a programmable logic device that implements packet processing circuits that may employ sector-aligned memory, in accordance with an embodiment.
Figure 15:
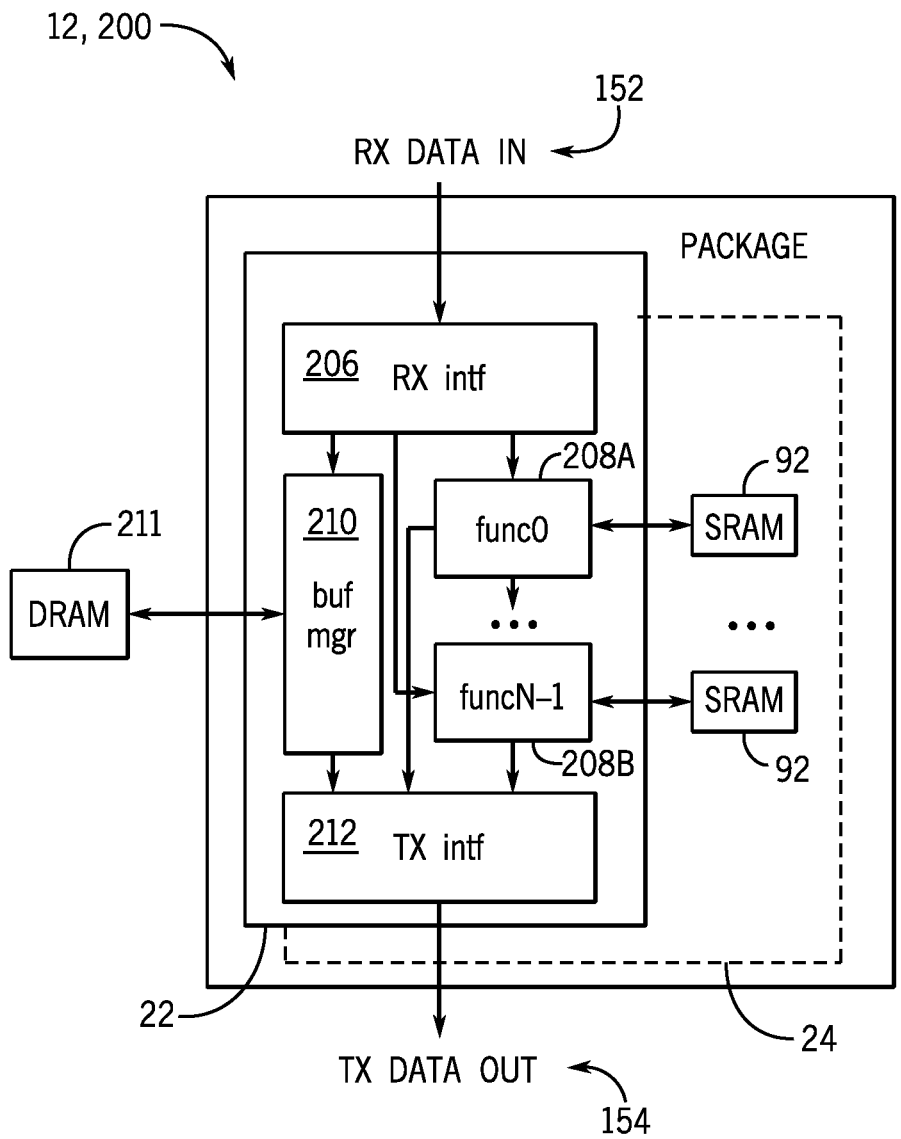
FIG. 15 is a diagram of a programmable logic device that implements packet processing circuits that may employ a combination of sector-aligned memory and external memory, in accordance with an embodiment.
Figure 17:
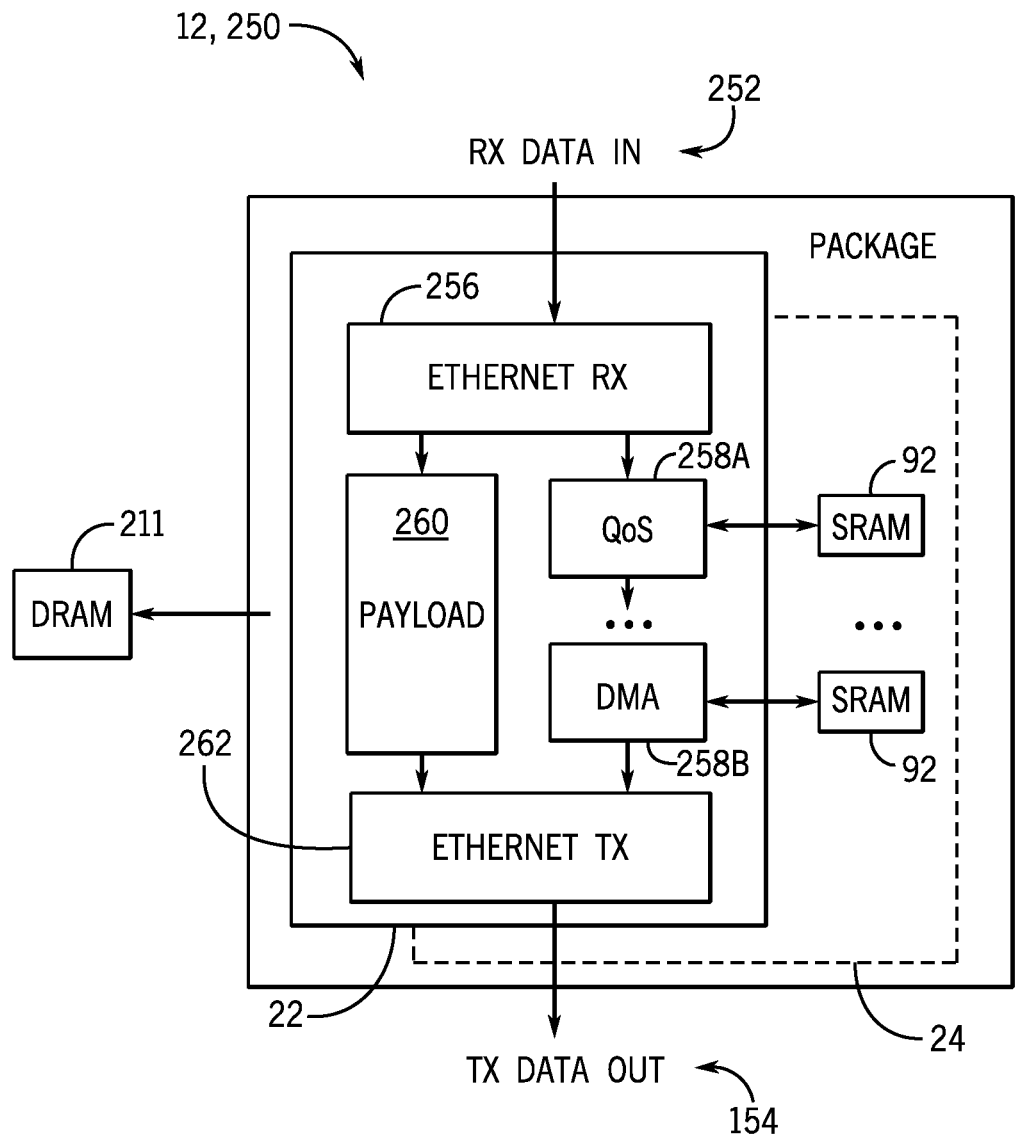
FIG. 17 is a diagram of a programmable logic device that implements Ethernet packet processing, in accordance with an embodiment.

FIGS. 13, 15, and 17 illustrate schematic diagrams for embodiments of network processors or network-processing systems, which may employ low-latency, high-capacity on-package memory, as discussed herein. For clarity of description, the schematic diagrams illustrate systems with an ingress data path (e.g., a data path for reception of packets) and an egress data path (e.g., a data path for transmission of packets) with separate reception and transmission blocks or interfaces. It should be understood, however, that embodiments of the disclosure may have bi-directional interfaces and that these interfaces may implement mirrored datapaths. For example, a network processor may have a first bi-directional interface that implements Ethernet protocol and a second bi-directional interface that implements Infiniband protocol. In such system, both interfaces may implement ingress datapath functions and egress datapath functions based on whether the interface is transmitting or receiving data.

FIG. 13 illustrates a schematic diagram for a packet processing system 150, which may be implemented in a programmable logic device 12. As discussed above, the packet processing system 150 may be implemented as a configuration of the programmable fabric in a fabric die 22. It should be understood that the packet processing system 150 may share logic resources with other circuits implemented in the programmable logic device 12. Moreover, the packet processing system 150 may have access to memory in the fabric die 22 and/or to memory in a base die (e.g., sector-aligned memory 92). The packet processing system 150 may be implemented using a portion of a sector of the fabric die 22, a full sector of the fabric die 22, or be distributed across multiple sectors of the fabric die 22. As discussed above, the memory in the base die 24 that is used by the packet processing system 150 may be in a sector that corresponds to the sectors of the fabric die 22 assigned to the packet processing system 150. In some embodiments, the packet processing system 150 may employ memory in different sectors. Communication between memory and fabric circuitry may take place using the NOC (e.g., NOC system 100).

The packet processing system 150 may receive incoming data 152 in the form of packets or as a data stream, and may transmit outgoing data 154 in the form of packets or as a data stream. The packet processing system 150 may include a receive interface 156. In embodiments associated with data packets, the receive interface 156 may perform functions such as parsing of header or payload and/or validation of packet data.

Based on the functionalities implemented by the packet processing system 150, a portion or the entire data may be transmitted from the receive interface 156 to one or more function blocks 158A and 158B. Function blocks 158A and 158B may be soft logic implemented in programmable fabric of the fabric die 22. In the illustrated system, the function blocks 158A and 158B are arranged in a processing pipeline. As discussed above, the function blocks 158A and 158B may employ large data structures to perform the functionality. To that end, the function blocks 158A and/or 158B may access control data structures from the sector-aligned memory 92. Moreover, in certain situations, the function blocks 158A and 158B may process large data packets or portions thereof, and the sector-aligned memory 92 may be used as an operating memory to facilitate data processing operations. Examples of functionalities implemented by function blocks 158A and 158B include table lookups, QoS traffic management, or virtualization management.

In some embodiments, the function blocks 158A and 158B may perform operations on the header of the packets. In such embodiments, the traffic of the payload may be managed by a buffer manager 160. Buffer manager 160 may instruct storage of the payload in the memory of the base die 24 to facilitate low-latency processing of the payload. For example, if the programmable logic device 12 has a second data processing circuit (e.g., another packet processing system) in a different sector of the fabric die 22 that receives data from the packet processing system, the buffer manager 160 may transmit a reference (e.g., a pointer, a memory address) of the payload memory and the second data processing may retrieve the payload directly from the base die 24. To that end, a NOC of the base die 24 may be used.

Following the processing functionality, a transmit interface 162 may be used to transmit data from the packet processing system 150. In some embodiments, the transmitted data may be a packet and in some embodiments, the transmitted data may be a data stream. It should be noted that the receive interface 156 and the transmit interface 162 may implement the same data format or data protocol (e.g., Ethernet packets, peripheral component interconnect express (PCIe) data). In some embodiments, the packet processing system 150 may be a data bridge for conversion between different data formats or protocols and, thus, the receive interface 156 and transmit interface 162 may implement different data formats or protocols. For example, a packet processing system 150 may receive incoming data 152 in an Ethernet format and may transmit data 154 in a PCIe format.

Figure 14:
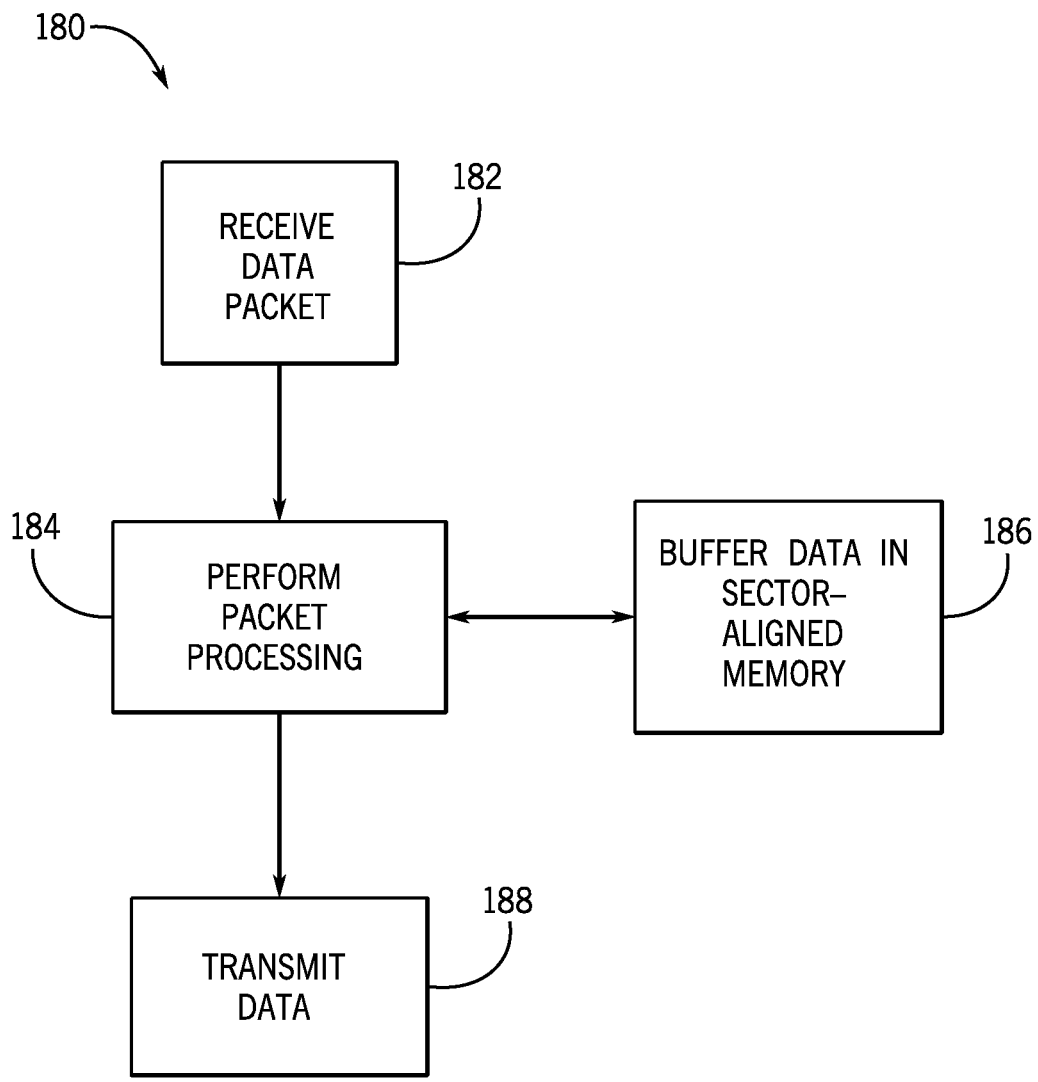
FIG. 14 is a flowchart for a method to employ low-latency memory for packet processing, in accordance with an embodiment.

The flowchart of FIG. 14 illustrates a method 180 for packet processing in a system such as the one illustrated in FIG. 14. The method 180 may be implemented by network processor in a multi-die device. For example, method 180 may be implemented by a network processor in programmable fabric or by a network processor implemented in ASIC. In a process 182, the network processor may receive a data packet. In process 184, the network processor may perform one or more functionalities, as discussed above. The network processor may use a low latency memory in a base die of the multi-die device, as illustrated in process 186. As discussed above, process 186 may include buffering of the network packets or portions thereof and/or retrieving data structures stored in a memory of the base die. In a process 188, the network processor may transmit a data packet.

FIG. 15 illustrates a schematic diagram for a packet processing system 200, which may be implemented in a programmable logic device 12. Packet processing system 200 may employ an external memory device 211 to facilitate packet processing. As discussed above, the packet processing system 200 may be implemented as a configuration of the programmable fabric in a fabric die 22. It should be understood that the packet processing system 200 may share logic resources with other circuits implemented in the programmable logic device 12. Moreover, the packet processing system 200 may have access to user memory in the fabric die 22 and/or to memory in a base die (e.g., sector-aligned memory 92).

The packet processing system 200 may be implemented using a portion of a sector of the fabric die 22, a full sector of the fabric die 22, or be distributed across multiple sectors of the fabric die 22. As discussed above, the memory in the base die 24 that is used by the packet processing system 200 may be in a sector that corresponds to the sectors of the fabric die 22 assigned to the packet processing system 200. In some embodiments, the packet processing system 200 may employ memory in different sectors. Communication between memory and fabric circuitry may take place using the NOC (e.g., NOC system 100).

Similarly to the packet processing system 150 of FIG. 13, the packet processing system 200 may receive incoming data 152 in the form of packets or as a data stream and may transmit outgoing data 154 in the form of packets or as a data stream. The packet processing system 200 may include a receive interface 206, which may perform functions such as validation of header information, parsing of a header, formation of packets, and/or parsing of payload.

Based on the functionalities implemented by the packet processing system 200, a portion or the entire data may be transmitted from the receive interface 206 to one or more function blocks 208A and 208B. Function blocks 208A and 208B may be logic implemented in programmable fabric of the fabric die 22. As illustrated, the function blocks 208A and 208B may be employed in a pipelined manner and/or individually. That is, in the illustrated system, the function blocks 208A and 208B can be configured to communicate directly with the receive interface 206 and/or the transmit interface 212, discussed in detail below. As discussed above, the function blocks 208A and 208B may exchange instructions, data packets or portions thereof, or data with the sector-aligned memory 92, to facilitate data processing operations. Examples of functionalities implemented by function blocks 208A and 208B include table lookups, QoS traffic management, or virtualization management.

The packet processing system 200 also includes a buffer manager 210, which may manage payloads of packets that are not used by the function blocks 208A and 208B. To that end, the traffic of the payload may be managed by a buffer manager 210. Buffer manager 210 may store the payload in an external memory device 211. To preserve integrity of the incoming packages, the buffer manager 210 may generate and/or manage a data structure that links a payload stored in the external memory device 211 to a header being processed by the function blocks 208A and 208B.

The external memory device 211 may have a higher latency as compared to the sector-aligned memory 92. In some embodiments, the external memory device 211 may be a shared memory that supports DMA and/or RDMA, and payloads may be stored in a buffer (e.g., sets of buffers in a link list) stored in the external memory device. In such application, the packet processing system 200 may receive a reference or a descriptor (e.g., a link list address) to the payload instead of the payload. In such system, the buffer manager 210 may manage the reference or descriptor to the payload by storing the data structure (e.g., link list address) in the sector-aligned memory 92.

Following the processing functionality, the transmit interface 212 may be used to transmit data from the packet processing system 200. In some embodiments, the transmitted data may be a packet and in some embodiments, the transmitted data may be a data stream. It should be noted that the receive interface 206 and the transmit interface 202 may implement the same data format or data protocol (e.g., Ethernet packets, PCIe data), or different data formats or protocols.

The embodiments described above may be used to facilitate networking applications that implement network function virtualization in a reprogrammable manner. To that end, a programmable logic device 12 having a fabric die 22 and a base die 24, such as the embodiments described herein, may be capable of dynamic configuration of the fabric die 22 to perform one or more virtual network functions (VNF) in soft logic in a FPGA (e.g., function blocks 158A and 158B in FIG. 13, function blocks 208A and 208B in FIG. 15) from configuration data stored in the base die 24. That is, sector-aligned memory 92 in the base die 24 may store different configuration data that (e.g., bitstreams, soft IP blocks) that implement different functionalities and the fabric die 22 may load a soft IP from the base die 24 to implement a functionality on-demand, during operation of the programmable logic device 12.

Implementations may allow the network processing systems to have multiple VNF profiles (e.g., VNF configuration personas), that may be swapped using the partial reconfiguration process discussed above. The VNF (e.g., bitstreams, soft IP blocks) may reside in one or more sectors, and there may be more than one VNF profile per FPGA. For example, a VNF profile may include security applications and a second VNF profile may include checksum applications. A user that is running a security VNF may change the operation of the network processing system with a checksum VNF profile. It should be understood that the high-speed interface (e.g., a microbump interface) between the fabric die 22 and the base die 24, discussed above, allows for fast reconfiguration. Moreover, the fabric die 22 may implement a partial reconfiguration, during which other portions of the logic may remain in operation (e.g., in user mode) while other portions may be reprogrammed. In some embodiments, the virtualized network processor may swap VNF profiles in microseconds.

Figure 16:
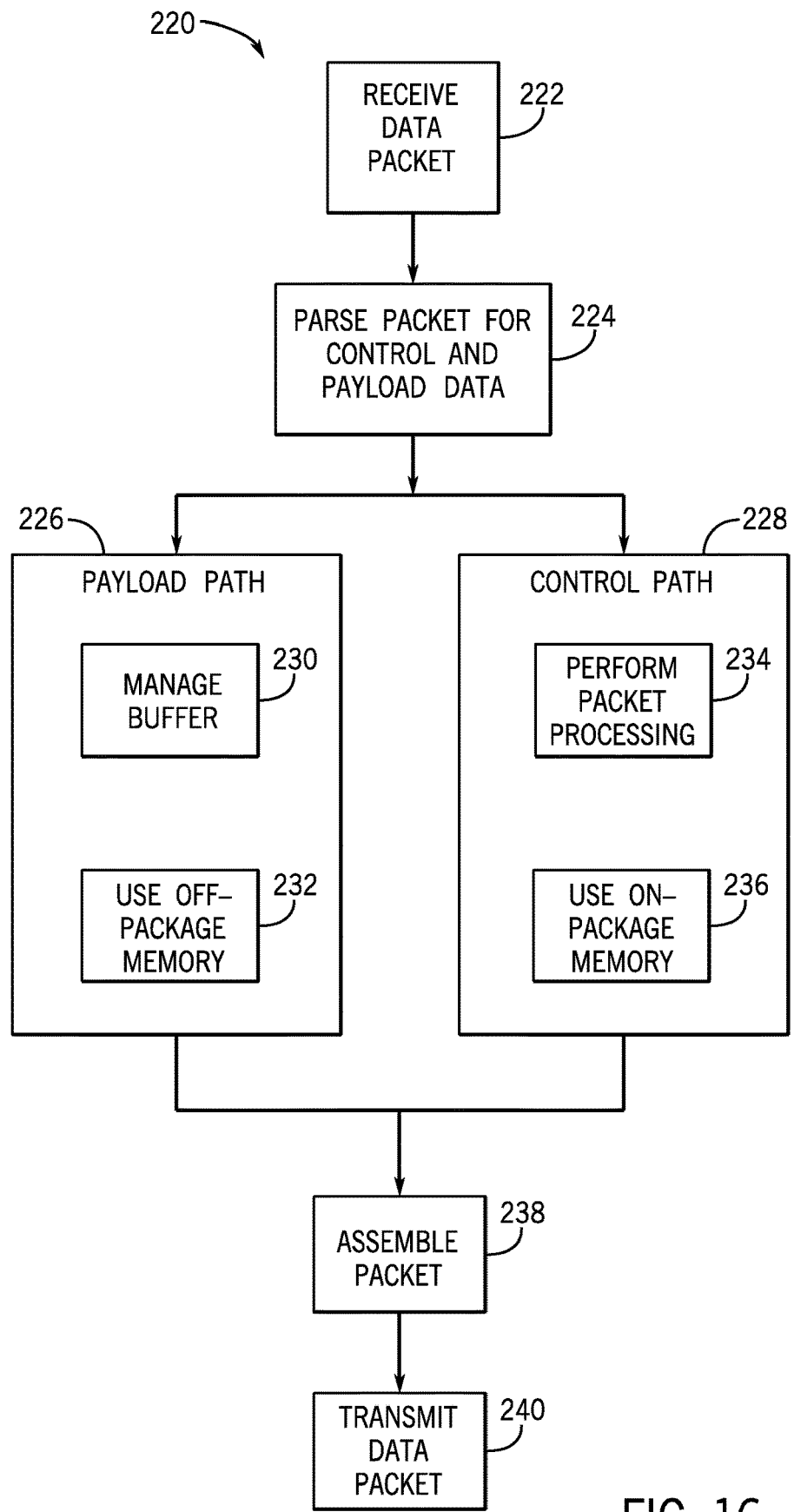
FIG. 16 is a flowchart for a method that employs sector-aligned memory and external memory for packet processing, in accordance with an embodiment.

The flowchart of FIG. 16 illustrates a method 220 for packet processing in a system such as the one illustrated in FIG. 15. The method 220 may be implemented by network processor in a multi-die device that is coupled to a memory device. For example, method 220 may be implemented by a network processor in programmable fabric or by a network processor implemented in ASIC. In a process 222, the network processor may receive a data packet. In process 224, the network processor may parse the data packet to identify portions that may be employed for processing in the network processor (i.e., control data) and portions that may be buffered during the packet processing (i.e., payload data). The payload data may be processed through a payload path 226, which may include a process 230 for managing the data flow in an external memory device and a process 232 for exchanging data with the external memory device. The control data may be processed through a control path 228, which may include one or more packet processing functionalities 234. The control path may also include data exchange processes 236 with a low latency memory localized in a base die of the multi-die device. In a process 238, which may take place following the control path 228, a data packet may be assembled for transmission. In a process 240, the data packet may be transmitted by the network processor.

With the foregoing in mind, FIG. 17 illustrates an implementation of a network processing system implemented in a multi-die package having high-capacity and/or low-latency memory. FIG. 17 illustrates a schematic diagram for an Ethernet packet processing system 250, which may be implemented in a programmable logic device 12. The Ethernet packet processing system 250 may employ sector-aligned memory 92 as a low-latency memory and an external memory device 211 as a high capacity memory, for the processing of packets. The Ethernet packet processing system 250 may be implemented as a configuration of the programmable fabric in a fabric die 22. It should be understood that the Ethernet packet processing system 250 may share logic resources with other circuits implemented in the programmable logic device 12, including packet processing and/or data streaming systems for other protocols.

As with the above discussed packet processing systems, the Ethernet packet processing system 250 may be implemented using a portion of a sector of the fabric die 22, a full sector of the fabric die 22, or may be distributed across multiple sectors of the fabric die 22. As discussed above, the sector-aligned memory 92 in the base die 24 that is used by the Ethernet packet processing system 250 may be in a sector that corresponds to the sectors of the fabric die 22 assigned to the Ethernet packet processing system 250. In some embodiments, the Ethernet packet processing system 250 may employ memory in different sectors. Communication between memory and fabric circuitry may take place using the NOC (e.g., NOC system 100).

The Ethernet packet processing system 250 may receive incoming Ethernet packets 252 and may transmit outgoing Ethernet packets 254. The Ethernet packet processing system 250 may include a receive interface 256, which may perform functions associated with pre-processing of Ethernet packages. Functions performed by the receive interface 256 may include parsing header and/or payload of a packet, validation of header and/or payload information, timing functionality (e.g., IEEE 1588 Precision Time Protocol), header encryption/decryptions, and/or packet type identification and/or classification. In some embodiments, the incoming Ethernet packets 252 and/or outgoing Ethernet packets 254 may be stored in the external memory device 211 or in the sector-aligned memory 92, and the incoming Ethernet packets 252 may include the packet header and a reference to the payload data that is stored in the external memory device 211. In some embodiments, the receive interface 256 may perform packetization (i.e., may form packets) from data streams based on, for example, length of the received data, the presence of commas, or the presence of other end-of-stream flags.

The headers of the incoming Ethernet packets 252 may be processed by one or more Ethernet processing blocks 258A and 258B. While the illustrated example in FIG. 17 displays a QoS processing block 258A and a direct memory access (DMA) processing blocks 258B, the Ethernet processing blocks may perform other functionalities including packet routing, encryption, decryption, packet filtering, and/or denial-of-service attack protection.

In some embodiments that may employ remote direct memory access and/or network interface virtualization, the Ethernet processing blocks 258A and 258B may also include functionalities to facilitate those operations. As discussed above, many of the operations may employ large datasets, including priority tables, QoS tables, cryptographic keys, virtualization management tables, buffer and/or queue managers, routing tables, and/or filtering tables that may be stored in the sector-aligned memory 92. The use of the low-latency, high-capacity sector aligned memory 92 for header processing may substantially improve the performance of the Ethernet packet processing system 250.

The Ethernet packet processing system 250 also includes a payload manager 260, which may manage payloads traffic of the Ethernet packets 252. Payload manager 260 may store the payload in an external memory device 211. The payload manager 260 may also generate and/or receive from the external memory device 211 a reference to the physical memory in which the payload is stored and the reference may be employed for buffering and/or queuing. In some embodiments, the external memory device 211 may be a shared memory that supports direct memory access (DMA) and/or RDMA, as discussed above. In such systems, the payload manager 260 may receive a reference to the payload and may employ it for queuing/buffering. Following the packet processing, the Ethernet packet processing system 250 may be ready to transmit an Ethernet packet and the transmit interface 262 may be used to perform post-processing Ethernet functionalities. The transmit interface 262 may reassemble the header and the payload. The transmit interface 262 may also produce an Ethernet package formed by the header and a reference to the payload. The transmit interface 262 may also include egress packet functionalities, including timing functionalities (e.g., IEEE 1588 precision-time protocol), packet assembly, physical layer address routing, and/or packet validation. As discussed above, many of the operations may employ large datasets, including data structures and packet buffering. The use of the low-latency sector aligned memory 92 for header processing may substantially improve the performance of the Ethernet packet processing system 250.

Figure 18:
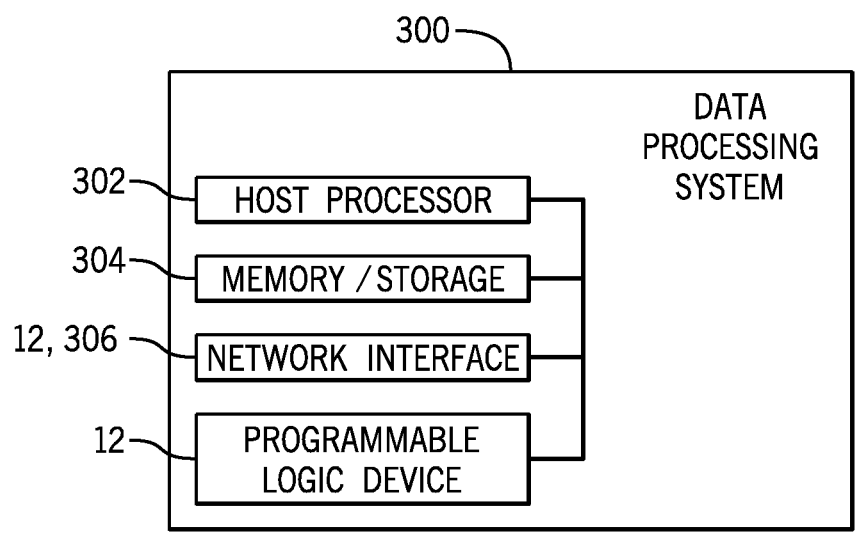
FIG. 18 is a block diagram of a data processing system that may be used in the system of FIG. 12, which may employ the programmable logic device to implement packet-processing functions, in accordance with an embodiment.

As discussed above, the programmable logic device 12 may be a network processor, and/or may be a component of a data processing system that includes a network processor. For example, the programmable logic device 12 may be a component of a data processing system 300, shown in FIG. 18. The data processing system 300 includes a host processor 302, memory and/or storage circuitry 304, and a network interface 306. The data processing system 300 may include more or fewer components (e.g., electronic display, user interface structures, application specific integrated circuits (ASICs)). The host processor 302 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 300 (e.g., to perform machine learning, video processing, voice recognition, image recognition, data compression, database search ranking, bioinformatics, network security pattern identification, spatial navigation, or the like). The data processing system 300, or a portion thereof, may be implemented within logic fabric of the programmable logic device 12.

The memory and/or storage circuitry 304 may include random access memory (RAM), read-only memory (ROM), one or more hard drives, flash memory, or the like. The memory and/or storage circuitry 304 may be external memory to the programmable logic device 12 and may hold data to be processed by the data processing system 300 and/or the programmable logic device 12. Examples of memory and/or storage circuitry 304 include the external memory device 211, illustrated in FIGS. 15 and 17. In some cases, the memory and/or storage circuitry 304 may also store configuration programs (e.g., bitstream) for programming the programmable logic device 12. The network interface 306 may allow the data processing system 300 to communicate with other electronic devices, as discussed above. The network interface 306, or a portion thereof, may be implemented within logic of the programmable logic device 12, as illustrated in FIGS. 13, 15, and/or 17.

In one example, the data processing system 300 may be part of a data center that processes a variety of different requests. For instance, the data processing system 300 may receive a data processing request via the network interface 306 to perform machine learning, video processing, voice recognition, image recognition, data compression, database search ranking, bioinformatics, network security, pattern identification, spatial navigation, or some other specialized task. The host processor 302 may cause the programmable logic fabric of the programmable logic device 12 to be programmed with a particular network functionality related to requested task.

For instance, the host processor 302 may instruct that configuration data (bitstream) stored on the memory/storage circuitry 304 or cached in sector-aligned memory of the programmable logic device 12 to be programmed into the programmable logic fabric of the programmable logic device 12. The configuration data (bitstream) may represent a circuit design for a particular network function relevant to the requested task. Due to the high density of the programmable logic fabric, the large bandwidth of the interconnect between the base die and the fabric die, the proximity of the substantial amount of sector-aligned memory to the programmable logic fabric, or other features of the programmable logic device 12 that are described herein, the programmable logic device 12 may rapidly assist the data processing system 300 in performing the requested task. Indeed, in one example, an accelerator may assist with a voice recognition task less than a few milliseconds (e.g., on the order of microseconds) by rapidly accessing and processing large amounts of data in the accelerator using sector-aligned memory.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . " it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An integrated circuit device comprising:
a base die that comprises memory; and
an application-specific integrated circuit die coupled to the base die via an interface, wherein the application-specific integrated circuit die and the base die are vertically aligned so the base die is vertically below at least a portion of a surface area of the application-specific integrated circuit die with a region of the application-specific integrated circuit die being vertically aligned with a corresponding region-aligned memory of the memory of the base die that is allocated to the region, wherein the application-specific integrated circuit die is to implement a processing function that uses the region-aligned memory.

2. The integrated circuit device of claim 1, wherein the processing function employs a data structure for performance of the processing function or a data packet to be processed by the processing function, or both, and wherein the base die stores the data structure, the data packet, or both.

3. The integrated circuit device of claim 1, wherein the interface comprises a high-density interconnect, a 3D interconnect, or a microbump interconnect.

4. The integrated circuit device of claim 1, wherein the application-specific integrated circuit die is to implement a processor.

5. The integrated circuit device of claim 4, wherein the processor is implemented in the region of the application-specific integrated circuit die and accesses a data structure or data packet stored in a first region-aligned memory circuitry associated with the region.

6. The integrated circuit device of claim 4, wherein the processor is implemented in the region of the application-specific integrated circuit, a data structure is stored in a second region-aligned memory, and the processor accesses the data structure using a network-on-chip (NOC) of the base die.

7. The integrated circuit device of claim 1, wherein the application-specific integrated circuit die is to implement a network processor.

8. The integrated circuit device of claim 7, wherein the application-specific integrated circuit die is configured to implement a programmable logic in the application-specific integrated circuit die.

9. The integrated circuit device of claim 7, wherein the network processor is to implement a quality of service (QOS) functionality, a packet filtering functionality, a packet routing, an encryption functionality, a decryption functionality, an error checking functionality, a direct memory access management functionality, or a look-up table functionality, or a combination thereof.

10. A system comprising:
a memory; and
a processing device comprising:
a base die that comprises on-package memory comprising a plurality of regions; and
a processor die having a plurality of regions, wherein the processor die and the base die are vertically aligned so the base die is vertically below at least a portion of a surface area of the processor die with the plurality of regions of the base die vertically aligned to corresponding regions of the plurality of regions of the processor die, and the processing device is operable to execute processes using data from the base die.

11. The system of claim 10, wherein the processor die comprises an application-specific integrated circuit (ASIC) or a general-purpose processor, or any combination thereof.

12. The system of claim 10, wherein the processing device is configured to:
implement a first function configured to exchange data with the on-package memory in the base die using a high-speed interface between the processor die and the base die; and
utilize buffer manager circuitry configured to exchange data with the memory.

13. The system of claim 12, wherein the first function comprises processing header data, and wherein the buffer manager circuitry processes payload data and stores a link data structure that associates a header of the header data with a payload of the payload data.

14. The system of claim 12, wherein the buffer manager circuitry exchanges payloads with the memory or references to payloads with the memory.

15. The system of claim 12, wherein the processor die is programmable to swap the first function for a second function in the processor die.

16. The system of claim 10, wherein the processing device comprises a data bridge that receives data in a first protocol and transmits data in a second protocol different from the first protocol.

17. The system of claim 10, comprising an interface that comprises a high-density interconnect, a 3D interconnect, or a microbump interconnect between the base die and the processor die.

18. A system comprising:
a memory die that comprises on-package memory comprising a plurality of regions; and
a network processor die to implement a network processor and having a plurality of regions, wherein the processor die and the memory die are vertically aligned so the memory die is vertically below at least a portion of a surface area of the processor die with the plurality of regions of the memory die vertically aligned to corresponding regions of the plurality of regions of the network processor die, and the network processor is operable to execute processes using data from the memory die.

19. The system of claim 18, wherein the network processor is to:
implement a first virtual network function (VNF) profile that comprises a first processing function;
switch from the first processing function to a second processing function; and
implement a second VNF profile that comprises the second processing function.

20. The system of claim 19, wherein the first processing function and the second processing function each comprise at least one of a quality of service (QOS) functionality, a packet filtering functionality, a packet routing, an encryption functionality, a decryption functionality, an error checking functionality, a direct memory access management functionality, or a look-up table functionality, or a combination thereof, and the first processing function and the second processing functions are different.

* * * * *